US012605885B2

(12) United States Patent
Vella et al.

(10) Patent No.: US 12,605,885 B2
(45) Date of Patent: Apr. 21, 2026

(54) PIEZOELECTRIC COMPOSITES HAVING LOCALIZED PIEZOELECTRIC PARTICLES AND USE THEREOF IN ADDITIVE MANUFACTURING

(71) Applicants: XEROX CORPORATION, Norwalk, CT (US); NATIONAL RESEARCH COUNCIL OF CANADA, Ottawa (CA)

(72) Inventors: Sarah J. Vella, Milton (CA); Alexandros Vasileiou, Toronto (CA); Yujie Zhu, Mississauga (CA); Edward G. Zwartz, Mississauga (CA); Chantal Paquet, Ottawa (CA)

(73) Assignees: XEROX CORPORATION; NATIONAL RESEARCH COUNCIL OF CANADA, Ottawa (CA)

( * ) Notice: Subject to any disclaimer, the term of this patent is extended or adjusted under 35 U.S.C. 154(b) by 756 days.

(21) Appl. No.: 17/995,658

(22) PCT Filed: Mar. 22, 2022

(86) PCT No.: PCT/US2022/021413
§ 371 (c)(1),
(2) Date: Oct. 6, 2022

(87) PCT Pub. No.: WO2022/204201
PCT Pub. Date: Sep. 29, 2022

(65) Prior Publication Data
US 2023/0151210 A1     May 18, 2023

Related U.S. Application Data

(60) Provisional application No. 63/164,679, filed on Mar. 23, 2021.

(51) Int. Cl.
*B29C 64/118* (2017.01)
*B29C 48/05* (2019.01)
(Continued)

(52) U.S. Cl.
CPC ............ *B29C 64/118* (2017.08); *B29C 48/05* (2019.02); *B29C 64/10* (2017.08); *B29C 64/165* (2017.08); *B29C 64/314* (2017.08); *B29C 64/40* (2017.08); *B33Y 10/00* (2014.12); *B33Y 40/10* (2020.01); *B33Y 70/10* (2020.01); *B33Y 80/00* (2014.12); *C08L 23/06* (2013.01); *C08L 25/06* (2013.01); *C08L 53/005* (2013.01); *C08L 53/02* (2013.01); *C08L 67/04* (2013.01); *C08L 71/02* (2013.01); *C09D 4/06* (2013.01); *C09D 5/24* (2013.01); *C09D 7/61* (2018.01); *C09D 7/62* (2018.01); *C09D 7/63* (2018.01); *C09D 7/69* (2018.01); *C09D 7/70*

(2018.01); *C09D 167/04* (2013.01); *H10N 30/092* (2023.02); *H10N 30/852* (2023.02); *B29K 2023/18* (2013.01);
(Continued)

(58) Field of Classification Search
CPC ....... B29C 64/118; B29C 48/05; B29C 64/10; B29C 64/165; B29C 64/314; B29C 64/40; B33Y 10/00; B33Y 40/10; B33Y 70/10; B33Y 80/00; C08L 23/06; C08L 25/06; C08L 53/005; C08L 53/02; C08L 67/04; C08L 71/02; C09D 4/06; C09D 5/24; C09D 7/61; C09D 7/62
See application file for complete search history.

(56) References Cited

U.S. PATENT DOCUMENTS

| 10,392,521 B2 | 8/2019 | Ng et al. |
| 2016/0181506 A1 | 6/2016 | Sirbuly et al. |

(Continued)

FOREIGN PATENT DOCUMENTS

| CN | 111154253 A | 5/2020 |
| CN | 111187073 A | 5/2020 |

(Continued)

OTHER PUBLICATIONS

Persano et al., Active Polymer Nanofibers for Photonics, Electronics, Energy Generation and Micromechanics (2015), Elsevier: Progress in Polymer Science, vol. 43, pp. 48-95 (Year: 2015).*
(Continued)

*Primary Examiner* — Robert S Jones, Jr.
*Assistant Examiner* — Christiaan Roelofse
(74) *Attorney, Agent, or Firm* — Vorys, Sater, Seymour and Pease LLP

(57) ABSTRACT

Parts made by additive manufacturing are often structural in nature, rather than having functional properties conveyed by a polymer or other component present therein. Printed parts having piezoelectric properties may be formed using compositions comprising a polymer matrix comprising a first polymer material and a second polymer material that are immiscible with each other, and a plurality of piezoelectric particles substantially localized in one of the first polymer material or the second polymer material. The piezoelectric particles may remain substantially non-agglomerated when combined with the polymer matrix. The compositions may define a form factor such as a composite filament, a composite pellet, or an extrudable composite paste. Additive manufacturing processes using the compositions may comprise forming a printed part by depositing the compositions layer-by-layer.

16 Claims, 7 Drawing Sheets

(51) Int. Cl.

| | |
|---|---|
| B29C 64/10 | (2017.01) |
| B29C 64/165 | (2017.01) |
| B29C 64/314 | (2017.01) |
| B29C 64/40 | (2017.01) |
| B33Y 10/00 | (2015.01) |
| B33Y 40/10 | (2020.01) |
| B33Y 70/10 | (2020.01) |
| B33Y 80/00 | (2015.01) |
| C08L 23/06 | (2006.01) |
| C08L 25/06 | (2006.01) |
| C08L 53/00 | (2006.01) |
| C08L 53/02 | (2006.01) |
| C08L 67/04 | (2006.01) |
| C08L 71/02 | (2006.01) |
| C09D 4/06 | (2006.01) |
| C09D 5/24 | (2006.01) |
| C09D 7/40 | (2018.01) |
| C09D 7/61 | (2018.01) |
| C09D 7/62 | (2018.01) |
| C09D 7/63 | (2018.01) |
| C09D 167/04 | (2006.01) |
| H10N 30/092 | (2023.01) |
| H10N 30/85 | (2023.01) |
| B29K 23/00 | (2006.01) |
| B29K 25/00 | (2006.01) |
| B29K 33/00 | (2006.01) |
| B29K 67/00 | (2006.01) |
| B29K 101/12 | (2006.01) |
| B29K 105/00 | (2006.01) |
| B29K 105/04 | (2006.01) |
| B29K 105/16 | (2006.01) |
| B29K 505/08 | (2006.01) |
| B29K 507/04 | (2006.01) |
| B29K 509/00 | (2006.01) |
| B29K 509/02 | (2006.01) |
| C08K 3/04 | (2006.01) |
| C08K 3/22 | (2006.01) |
| C08K 7/06 | (2006.01) |
| C08K 9/04 | (2006.01) |

(52) U.S. Cl.
CPC ...... B29K 2025/08 (2013.01); B29K 2033/08 (2013.01); B29K 2033/12 (2013.01); B29K 2067/00 (2013.01); B29K 2067/04 (2013.01); B29K 2101/12 (2013.01); B29K 2105/002 (2013.01); B29K 2105/0023 (2013.01); B29K 2105/0085 (2013.01); B29K 2105/0088 (2013.01); B29K 2105/04 (2013.01); B29K 2105/16 (2013.01); B29K 2105/162 (2013.01); B29K 2505/08 (2013.01); B29K 2507/04 (2013.01); B29K 2509/00 (2013.01); B29K 2509/02 (2013.01); B29K 2995/0003 (2013.01); B29K 2995/0005 (2013.01); B29K 2995/0077 (2013.01); C08K 3/04 (2013.01); C08K 2003/2234 (2013.01); C08K 2003/2237 (2013.01); C08K 2003/2244 (2013.01); C08K 7/06 (2013.01); C08K 9/04 (2013.01); C08K 2201/001 (2013.01); C08K 2201/005 (2013.01); C08K 2201/011 (2013.01); C08L 2205/025 (2013.01); C08L 2207/04 (2013.01); C08L 2207/062 (2013.01)

(56) References Cited

U.S. PATENT DOCUMENTS

| | | | |
|---|---|---|---|
| 2016/0322560 A1 | 11/2016 | Sirbuly et al. | |
| 2017/0148539 A1 | 5/2017 | Prestayko et al. | |
| 2018/0141274 A1 | 5/2018 | Fink et al. | |
| 2019/0054659 A1 | 2/2019 | Tseng et al. | |
| 2019/0181331 A1 | 6/2019 | Lee et al. | |
| 2019/0284423 A1 | 9/2019 | Bodkhe et al. | |
| 2019/0365541 A1 | 12/2019 | Friis et al. | |
| 2019/0386199 A1* | 12/2019 | Van Den Ende | H10N 35/85 |
| 2020/0231794 A1* | 7/2020 | Treat | B29C 70/58 |
| 2020/0283651 A1 | 9/2020 | Wright et al. | |
| 2020/0357979 A1 | 11/2020 | Kim et al. | |
| 2021/0234089 A1 | 7/2021 | Zheng et al. | |
| 2022/0069195 A1 | 3/2022 | Markanday et al. | |

FOREIGN PATENT DOCUMENTS

| | | | |
|---|---|---|---|
| KR | 20210012731 A | 2/2021 | |
| WO | WO-2018104368 A1 * | 6/2018 | H02N 2/02 |
| WO | 2019227082 A1 | 11/2019 | |

OTHER PUBLICATIONS

Cholleti, E.R., "A Review on 3D printing of piezoelectricmaterials," IOP Conf. Ser.: Mater. Sci. Eng., 2018, 012046 (18 pp.), 2018.

Kim, H., et al., "Fabrication and Characterization of 3D printed BaTiO3/PVDF nanocomposites," J. Comp. Mater., 2018, pp. 197-206, 52.

Wu, Y., et al., "Fabrication of Composite Filaments with High Dielectric Permittivity for Fused Deposition 3D Printing," Materials, 2017, 1218 (11 pp.), 10.

Killic, A., et al., "Improving electret properties of PP filaments with barium titanate," J. Electrostatics, 2013, pp. 41-47, 2013.

Chiolerio, A., et al., "Effect of the fabrication method on the functional properties of BaTiO3:PVDF nanocomposites" J. Mater. Sci., 2013, pp. 6943-6951, 48.

Kim, K., et al., "3D Optical Printing of Piezoelectric Nanoparticle-Polymer Composite Materials," ACS Nano, 2014, pp. 9799-9806, 8.

Kim, K., et al., "Tunable Surface and Matrix Chemistries in Optically Printed (0-3) Pizeoelectric Nanocomposites," ACS App. Mater. Interfaces, 2016, pp. 33394-33398, 8.

Konuray, O. et al., "Dual-curable stereolithography resins for superior thermomechanical properties", Express polymer letters, 2020, pp. 881-894, 14.

Salaeh, S., "Processing of natural rubber composites and blends : relation between structure and properties," Materials Science [cond-mat.mtrl-sci]. Université Claude Bernard—Lyon I; Prince of Songkla University, 2014.

Fenouillot, F., et al., "Uneven distribution of nanoparticles in immiscible fluids: Morphology development in polymer blends," Polymer, 2009, pp. 1333-1350, 50.

Martinez-Ayuso, G., et al., "Homogenization of porous piezoelectric materials," International Journal of Solids and Structures, 2017, pp. 218-229, 113-114.

Bai, L., et al., "Kinetic Control of Graphene Localization in Co-continuous Polymer Blends via Melt Compounding," Langmuir, 2018, pp. 1073-1083, 34.

Guan, X., et al., "PZT/PVDF composites doped with carbon nanotubes," Sensors and Actuators A: Physical, 2013, pp. 228-231, 194.

Li, W., et al., "Enhancing conjugation degree and interfacial interactions to enhance dielectric properties of noncovalent functionalized graphene/poly (vinylidene fluoride) composites," Carbon, 2019, pp. 728-738, 141.

Li, W., et al., "The Control of Silica Nanoparticles on the Phase Separation of Poly(methyl methacrylate)/Poly(styrene-co-acrylonitrile) Blends," Macromol. Chem. Phys., 2013, pp. 2705-2715, 214.

Mccall W.R., et al., "Piezoelectric nanoparticle-polymer composite foams," ACS Appl. Mater. Interfaces, 2014, pp. 19504-19509, 6.

(56)                    References Cited

OTHER PUBLICATIONS

Utracki, L., "Compatibilization of Polymer Blends," Canadian Journal of Chemical Engineering, 2002, pp. 1008-1016, 80.

Vasileiou, A., et al., "A Noncovalent Compatibilization Approach to Improve the Filler Dispersion and Properties of Polyethylene/Graphene Composites," ACS Appl. Mater. Interfaces, 2014, pp. 1916-1925, 6.

Yao, D., et al., "3D Printed Nanocomposites: Achieving the Upper Bound of Piezoelectric Response in Tunable, Wearable 3D Printed Nanocomposites," Adv. Funct. Mater., 2019, p. 1970289, 29.

Zhao, P., et al, "Properties of cement-sand-based piezoelectric composites with carbon nanotubes modification," Ceramics International, 2916, pp. 15030-15034, 42.

Written Opinion and International Search Report from corresponding PCT Application No. PCT/US2022/021413 mailed Jul. 7, 2022.

\* cited by examiner 2.0kV 7.5mm x1.00k SE(UL) 10/7/2020          50.0um 10.0kV 7.1mm x2.00k SE(UL) 1/16/2021          20.0um 10.0kV 7.7mm x250 LM(UL) 4/1/2021    200um 10.0kV 7.5mm x2.00k SE(U) 3/30/2021    20.0um 10.0kV 7.4mm x1.50k SE(UL) 10/16/2020  30.0um 2.0kV 7.5mm x400 SE(UL) 10/6/2020      100um 10.0kV 7.6mm x1.50k SE(UL) 10/16/2020    30.0um

PIEZOELECTRIC COMPOSITES HAVING LOCALIZED PIEZOELECTRIC PARTICLES AND USE THEREOF IN ADDITIVE MANUFACTURING

FIELD

The present disclosure generally relates to additive manufacturing and, more particularly, extrudable compositions suitable for additive manufacturing to form printed parts exhibiting piezoelectric properties.

BACKGROUND

Additive manufacturing, also known as three-dimensional (3-D) printing, is a rapidly growing technology area. Although additive manufacturing has traditionally been used for rapid prototyping activities, this technique is being increasingly employed for producing commercial and industrial parts in any number of complex shapes. Additive manufacturing processes typically operate by building an object (part) layer-by-layer, for example, by 1) depositing a stream of molten printing material obtained from a continuous filament or other printing material source, 2) sintering powder particulates of a printing material using a laser, or 3) direct writing using an extrudable paste composition. The layer-by-layer deposition usually takes place under control of a computer to deposit the printing material in precise locations based upon a digital three-dimensional "blueprint" of the part to be manufactured, with consolidation of the printing material often taking place in conjunction with deposition to form the printed part. The printing material forming the body of a printed part may be referred to as a "build material" herein.

Additive manufacturing processes employing a stream of molten printing material for part formation may utilize a thermoplastic polymer filament as a source of the molten printing material. Such additive manufacturing processes are sometimes referred to as "fused deposition modeling" or "fused filament fabrication" processes. The latter term is used herein. Additive manufacturing processes employing thermoplastic polymer pellets or other polymer forms as a source of printing material are also known. Extrudable paste compositions comprising thermoplastic polymers or curable polymer precursors (resins) may also be utilized in similar direct writing additive manufacturing processes.

Additive manufacturing processes employing powder particulates of a printing material oftentimes perform directed heating in selected locations of a particulate bed (powder bed) following printing material deposition to promote coalescence of the powder particulates into a consolidated part. Techniques suitable for promoting consolidation of powder particulates to form a consolidated part include, for example, Powder Bed Fusion (PBF), selective laser sintering (SLS), Electron Beam Melting (EBM), Binder Jetting and Multi-Jet Fusion (MJF).

A wide range of parts having various shapes may be fabricated using the foregoing additive manufacturing processes. In many instances, build materials employed in such additive manufacturing processes may be largely structural in nature, rather than the polymer having an innate functionality itself. One exception is piezoelectric functionality, which may be exhibited in printed objects formed from polyvinylidene fluoride, a polymer which possesses innate piezoelectric properties upon poling. Piezoelectric materials generate charge under mechanical strain or, conversely, undergo mechanical strain when a potential is applied thereto. Potential applications for piezoelectric materials include, for example, sensing, switching, actuation, and energy harvesting.

Despite the desirability of forming printed parts having piezoelectric properties, there are only limited options for doing so at present. Other than polyvinylidene fluoride, the range of piezoelectric polymers is rather limited, and some alternative polymers are not suitable for being printed in additive manufacturing processes employing extrusion. For example, covalently crosslinked polymers are completely unworkable once they have been crosslinked, and polymer resins suitable for forming covalently crosslinked polymers may not by themselves afford form factors suitable for printing in fused filament fabrication and similar printing processes and/or printed parts formed from polymer resins may not be self-supporting before crosslinking takes place. Moreover, the piezoelectricity of polyvinylidene fluoride is rather low compared to other types of piezoelectric materials. These shortcomings may limit the range of printed parts having a piezoelectric response that may be obtained through present additive manufacturing processes.

Numerous ceramic materials having high piezoelectricity are available, such as lead-zirconium-titanate (PZT), but they are not printable by themselves and are often very brittle. Moreover, high sintering temperatures (>300° C.) may be needed to promote part consolidation and piezoelectric particle interconnectivity after depositing predominantly a piezoelectric ceramic. Admixtures of polymers and piezoelectric particles have not yet afforded high piezoelectric performance in printed parts. Poor dispersion of the piezoelectric particles in the polymer, particle agglomeration, and limited interactions between the piezoelectric particles and the polymer are to blame in many instances. Without being bound by any theory, the limited interactions between the piezoelectric particles and the polymer results in poor load transfer to the piezoelectric particles, thereby lowering the piezoelectric response obtained therefrom when mechanical strain is applied. Particle agglomeration may also play a role in this regard.

SUMMARY

In some embodiments, the present disclosure provides compositions comprising: a plurality of piezoelectric particles located in at least a portion of a polymer matrix comprising a first polymer material and a second polymer material that are immiscible with each other; wherein the piezoelectric particles are substantially localized in one of the first polymer material or the second polymer material. Printed parts may comprise the compositions.

In other various embodiments, the present disclosure provides additive manufacturing processes comprising: providing a composition comprising a plurality of piezoelectric particles located in at least a portion of a polymer matrix comprising a first polymer material and a second polymer material that are immiscible with each other; wherein the piezoelectric particles are substantially localized in one of the first polymer material or the second polymer material; and forming a printed part by depositing the composition layer-by-layer.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, as will occur to one having ordinary skill in the art and having the benefit of this disclosure.

DETAILED DESCRIPTION

Figure 1:
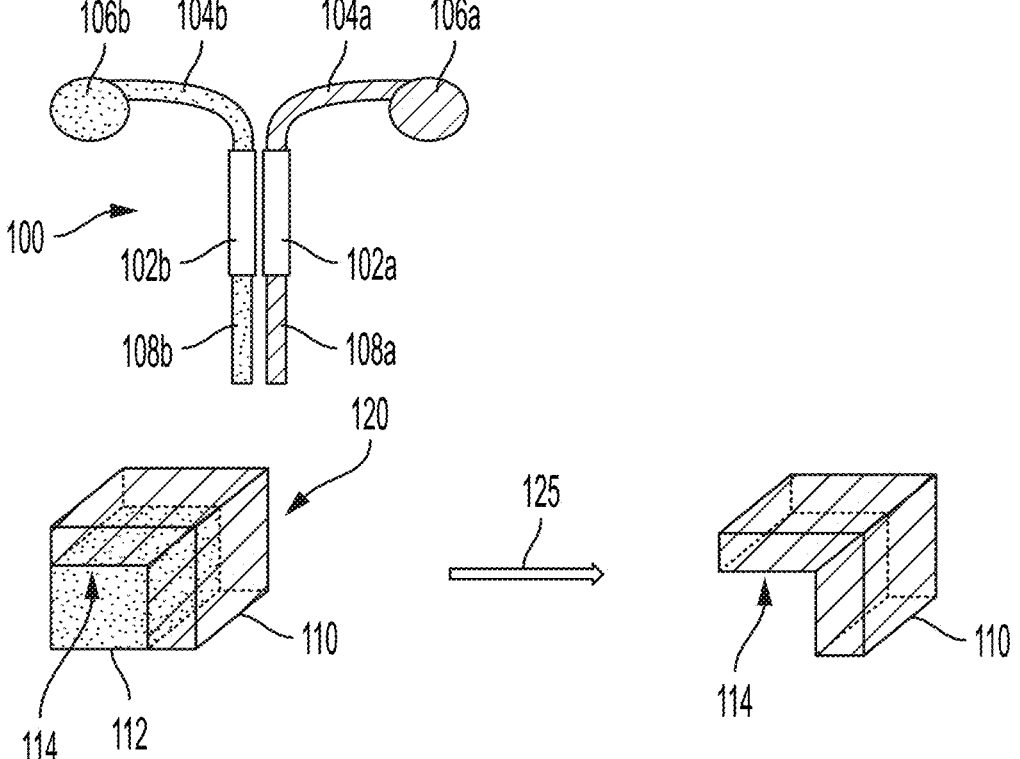
FIG. 1 shows a schematic of an illustrative fused filament fabrication process for producing a part using a build material and a removable support material.

The present disclosure generally relates to additive manufacturing and, more particularly, extrudable compositions suitable for additive manufacturing to form printed parts exhibiting piezoelectric properties. More specifically, the present disclosure provides compositions containing two immiscible polymer materials defining a polymer matrix, in which piezoelectric particles are dispersed in at least a portion of the polymer matrix and concentrated (substantially localized) within a single polymer phase of the polymer matrix. The compositions may define a composite having a form factor suitable for additive manufacturing. The two polymer materials, such as two different thermoplastic polymers, may be distributed co-continuously in the polymer matrix. The compositions are extrudable and define composites that may have various form factors such as, but not limited to, composite filaments, composite pellets, composite powders, and composite pastes.

As discussed above, additive manufacturing processes, such as fused filament fabrication, direct writing, or similar layer-by-layer deposition processes, are powerful tools for generating printed parts in a wide range of complex shapes. In many instances, the polymer materials used in layer-by-layer additive manufacturing processes are largely structural in nature and do not convey functional properties to a printed part by themselves. Polyvinylidene fluoride is a notable exception, which may form printed parts having piezoelectricity after suitable poling. Beyond polyvinylidene fluoride, there are few alternative polymer materials for introducing piezoelectricity to a printed part. Furthermore, the piezoelectricity of polyvinylidene fluoride may not be sufficiently large for some intended applications.

In response to the foregoing, compositions disclosed herein include a polymer matrix generated from blends of immiscible polymers, which may form a co-continuous polymer matrix at a range of blending ratios in some cases. The polymer matrix may feature piezoelectric particles concentrated or localized in one of the constituent polymer phases (or localized at a phase boundary between the constituent polymer phases), which may result from molecular interactions (thermodynamic) and/or through processing conditions (kinetic). Within the polymer phase in which the piezoelectric particles are localized, the piezoelectric particles may be dispersed uniformly or non-uniformly, including gradient distributions within the polymer phase comprising a particular polymer material. Piezoelectric effects may increase as the average distance between piezoelectric particles decreases. As a result, localizing piezoelectric particles within a specified polymer phase extending through a fraction of the total polymer volume may increase the piezoelectric coefficient ($d_{33}$) and overall electronic properties of the entire composition following printing and poling.

Confining the piezoelectric particles to a single polymer phase or location in a polymer matrix further allows the remaining polymer volume to be chosen from a polymer that imparts desirable mechanical properties, such as increased processability in extrusion, additive manufacturing, and molding processes and/or one of the polymer materials may be chosen due to its compatibility with the piezoelectric particles. In some cases, the polarity of at least one of the first and second polymer materials within the polymer matrix may aid in poling and enhancing the piezoelectric properties of a printed part.

Compositions disclosed herein may also feature the piezoelectric particles remaining in a substantially non-agglomerated and dispersed state within the polymer matrix following printing. Distribution of the piezoelectric particles as individuals rather than as agglomerates may afford a significant increase in the piezoelectric response obtained after poling, because there may be a greater particle surface area to undergo interaction with the polymer matrix to promote internal load transfer.

Load-transfer efficiency and, in effect, piezoelectric properties may also be modified by controlling the interfacial adhesion between the piezoelectric particles and the polymer matrix. Increasing interfacial adhesion by covalent bonding or non-covalent interactions may facilitate load transfer and promote synergy in energy absorption and electromechanical response. In some cases, covalent bond formation may take place following formation of a composite or printed part, which may provide flexibility in manufacturing into different shapes, geometries, and thicknesses before curing the final printed part to modify physical and/or piezoelectric properties. For example, covalent bond formation following printing may be beneficial if the composition may not be easily formed or printed when covalent bonds are already in place.

Suitable form factors of the composites that may be processed by extrusion in the disclosure herein include composite filaments, composite pellets, composite powders, composite pastes, or any combination thereof. Additional details regarding these various form factors follows herein. Polymer materials that may be present within the composites in the various form factors include one or more thermoplastic polymers, thereby allowing printed parts containing piezoelectric particles to be formed directly through extrusion and solidification of the polymer material. Optionally, a polymer precursor, such as a curable resin, may be present in combination with at least one thermoplastic polymer in the compositions. The term "curable resin" refers to a divalent polymerizable substance that undergoes covalent crosslinking upon being cured. Polymer precursors, such as a curable resin, may be utilized, for example, when piezoelectric particles may not be adequately mixed with a pre-formed polymer (including when the polymer material comprises a thermosetting or similar covalently crosslinked polymer) or the composition may not be easily extruded with the polymer material already in a polymerized state. In the case of a printed part comprising at least one covalently crosslinked polymer, preferably in addition to at least one thermoplastic polymer with which the at least one covalently crosslinked polymer is immiscible, the resulting polymer matrix may exhibit significant stiffness that may again promote load transfer to the piezoelectric particles to increase the piezoelectric response obtained therefrom.

Composite filaments compatible with fused filament fabrication may be formed in the disclosure herein. Although composite filaments may be an advantageous and particularly versatile form factor, it is to be realized that composite pellets may also be produced through melt blending processes and used in similar additive manufacturing processes. Namely, a polymer material comprising at least one thermoplastic polymer and piezoelectric particles may be combined with one another under melt blending conditions, and instead of extruding to form composite filaments, larger extrudates may be produced, which may then be cut, shredded, pulverized, or the like to afford composite pellets of a specified size and geometry or composite powders having even smaller dimensions and a wide distribution of particle sizes. Other than having a different shape, the microscopic morphology of the composite pellets and composite powders may be similar to that of composite filaments. Like composite filaments, composite pellets and composite powders may be subsequently processed into printed parts having piezoelectric properties under suitable additive manufacturing conditions.

In the disclosure herein, "filaments" are to be distinguished from "fibers" on the basis that filaments comprise a single elongate form factor, whereas fibers comprise multiple filaments twisted together (bundled) to form a fine thread or wire in which the individual filaments remain identifiable. As such, filaments have smaller diameters than do fiber bundles formed therefrom, assuming no filament compression takes place when forming a fiber bundle. Filaments obtained by solution electrospinning or melt electrospinning are usually up to about 100 μm in diameter, which is too small to be effectively printed using fused filament fabrication. The composite filaments obtained by melt blending and extrusion in the disclosure herein, in contrast, may be about 0.5 mm or more in size and dimensioned for compatibility with a particular printing system for fused filament fabrication.

Another suitable form factor that may be produced in the disclosure herein is an extrudable composite paste. As used herein, the term "paste" refers to a composition that is at least partially fluid at a temperature of interest. The term "paste" does not necessarily imply an adhesive function of any type. Moreover, the terms "paste" and "ink" may be used interchangeably with one another in the disclosure herein with respect to direct writing additive manufacturing processes. Unlike composite filaments and composite pellets discussed in brief above, extrudable composite pastes may comprise at least one solvent to facilitate extrusion. The polymer material may be at least partially dissolved in the at least one solvent, along with suspended piezoelectric particles, or the polymer material and the piezoelectric particles may be processed into composite particles that are suspended together in the solvent. The at least one solvent may or may not dissolve the polymer material present therein. Optionally, suitable composite pastes may be at least biphasic and contain at least two immiscible fluid phases, wherein the piezoelectric particles and the polymer material are present in one or both of the at least two immiscible fluid phases. Carbon nanomaterials, if present, may be localized in a phase with the polymer material and/or the piezoelectric particles or be present in a different phase altogether. Localization of at least the piezoelectric particles in one phase may increase the piezoelectric response attainable therefrom, since the effective concentration of the piezoelectric particles is increased. The polymer material and the piezoelectric particles may be processed into a composite, such as through melt blending and decreasing particle size as discussed above, wherein particles of the resulting pre-made composite are present in at least one phase of an extrudable composite paste. Alternately, a polymer material may be at least partially dissolved in at least one phase of an extrudable composite paste, and dispersion of the piezoelectric particles within the polymer material may take place as the extrudable composite paste is extruded into a desired shape when forming a printed part. Additional details regarding extrudable composite pastes are also provided hereinbelow.

Any of the foregoing form factors may have their piezoelectric properties enhanced by introducing covalent bonding and/or one or more non-covalent interactions between the polymer material and the piezoelectric particles according to the disclosure herein. The resulting improvement in load transfer between the polymer material and the piezoelectric particles may improve the piezoelectric response, as well as increase mechanical strength of the composites and printed parts obtained therefrom. Advantageously, various types of piezoelectric particles may be functionalized with a moiety that may react to form a covalent bond and/or interact non-covalently with a complementary group within a polymer material. If not already present, one or more groups capable of forming covalent bonds and/or undergoing non-covalent interactions may be incorporated in a polymer material as well (e.g., through monomer functionalization, side chain functionalization of an existing polymer, grafting, and/or copolymerization).

Before addressing various aspects of the present disclosure in further detail, a brief discussion of additive manufacturing processes, particularly fused filament fabrication processes, parts will first be provided so that the features of the present disclosure can be better understood. FIG. 1 shows a schematic of an illustrative fused filament fabrication process for producing a part using a build material and a removable support material. As shown in FIG. 1, print head 100 includes first extruder 102a and second extruder 102b, which are each configured to receive a filamentous printing material. Specifically, first extruder 102a is configured to receive first filament 104a from first payout reel 106a and provide molten stream 108a of a first printing material, and second extruder 102b is configured to receive second filament 104b from second payout reel 106b and provide molten stream 108b of a second printing material.

Figure 2:
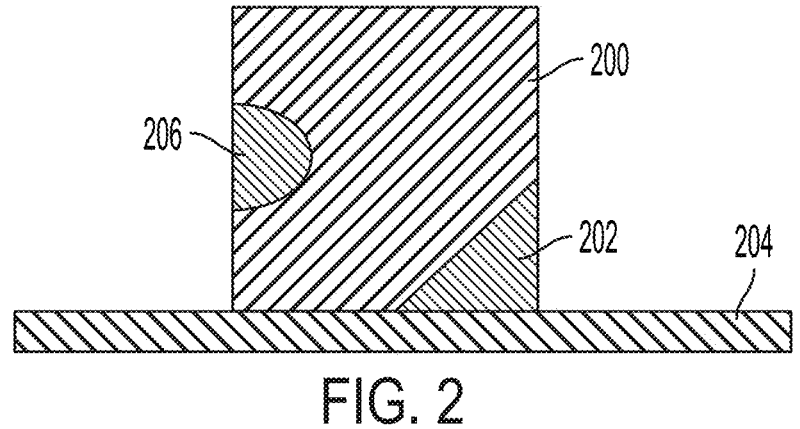
FIG. 2 shows a schematic of an illustrative part having a first removable support interposed between the part and a print bed and a second removable support interposed between two portions of the part.

Molten streams 108a,b are initially deposited upon a print bed (not shown in FIG. 1) to promote layer-by-layer growth of supported part 120. The first printing material (build material) supplied by first extruder 102a may be a piezoelectric composite used to fabricate part 110, and the second printing material (removable support material) supplied by second extruder 102*b* may be a dissolvable or degradable polymer, which is used to fabricate removable support 112 under overhang 114. Overhang 114 is not in direct contact with the print bed or a lower printed layer formed from the build material. Overhang 114 need not necessarily be present in a given printed part. In the part arrangement shown in FIG. 1, removable support 112 is interposed between overhang 114 and the print bed, but it is to be appreciated that in alternatively configured parts, removable support 114 may be interposed between two or more portions of part 110. FIG. 2, for example, shows illustrative part 200, in which removable support 202 is interposed between an overhang defined between part 200 and print bed 204, and removable support 206 is interposed between two portions of part 200.

Referring again to FIG. 1, once printing of part 110 and removable support 112 is complete, supported part 120 may be subjected to support removal conditions 125 that result in elimination of removable support 112 (e.g., dissolution or disintegration conditions, or the like) and leave part 110 with overhang 114 unsupported thereon. Support removal conditions 125 may include contact of supported part 120 with a solvent in which removable support 112 is dissolvable or degradable and part 110 is not.

If a printed part is being formed without an overhang or similar feature, it is not necessary to utilize a removable support material during fabrication of the printed part. Similarly, two or more different build materials may be utilized as well, such as when one or more of the build materials is structural in nature and one or more of the build materials is functional in nature. In non-limiting examples, a structural polymer may be concurrently printed with a piezoelectric composite of the present disclosure. Further disclosure directed to such piezoelectric composites is provided herein.

Compositions disclosed herein include a polymer matrix produced from a mixture of immiscible polymer materials that allows various properties to be selected and tuned for particular applications. More specifically, compositions of the present disclosure may comprise a plurality of piezoelectric particles located in at least a portion of a polymer matrix, preferably a continuous polymer matrix, comprising a first polymer material and a second polymer material that are immiscible with each other, and the piezoelectric particles are substantially localized in one of the first polymer material or the second polymer material. The compositions may collectively define an extrudable material that is a composite having possible form factors including, but not limited to composite filaments, composite pellets, composite powders, and composite pastes, in which piezoelectric particles are concentrated in one of the polymer materials. Printed parts may be formed from the compositions upon extrusion thereof. Where present, the piezoelectric particles may be dispersed within the polymer material in a uniform or non-uniform manner, such as a gradient distribution.

The compositions disclosed herein are extrudable and maintain the ability to form self-standing three-dimensional structures once extruded during an additive manufacturing process. The term "self-standing" means that a printed part holds its shape and/or exhibits a yield stress once the composition has been extruded into a desired shape. In contrast, compositions that do not hold their shape following extrusion are referred to as "conformal," since they may assume the profile of the surface upon which they are deposited. In many instances, the ability for a composite to be extruded and the ability for the composite to provide a self-standing structure following extrusion are mutually exclusive features. For example, a composite that is extrudable may lack sufficient mechanical strength to support itself upon being deposited in a desired shape, and a composite that hold its shape within a three-dimensional structure may be too rigid to be extruded. The composites described herein may further be processed into various form factors capable of undergoing continuous extrusion.

The term "extrusion" and various grammatical forms thereof refers to the ability of a fluid to be dispensed through a small nozzle. In addition to producing self-standing structures, the composites disclosed herein may be formulated to maintain extrudability once they are heated at or above a melting point or softening temperature of a thermoplastic polymer therein. Both the thermoplastic polymer and the piezoelectric particles, as well as amounts thereof, may be selected to convey extrudability to the composites described herein. Composite pastes containing a thermoplastic polymer need not necessarily be heated at or above the melting point or softening temperature to facilitate extrusion, since such compositions are already at least partially in a fluid form. Once the composites of the present disclosure have been extruded into a desired shape, the shape may be maintained as consolidation of the thermoplastic polymer(s) occurs.

Figure 3:
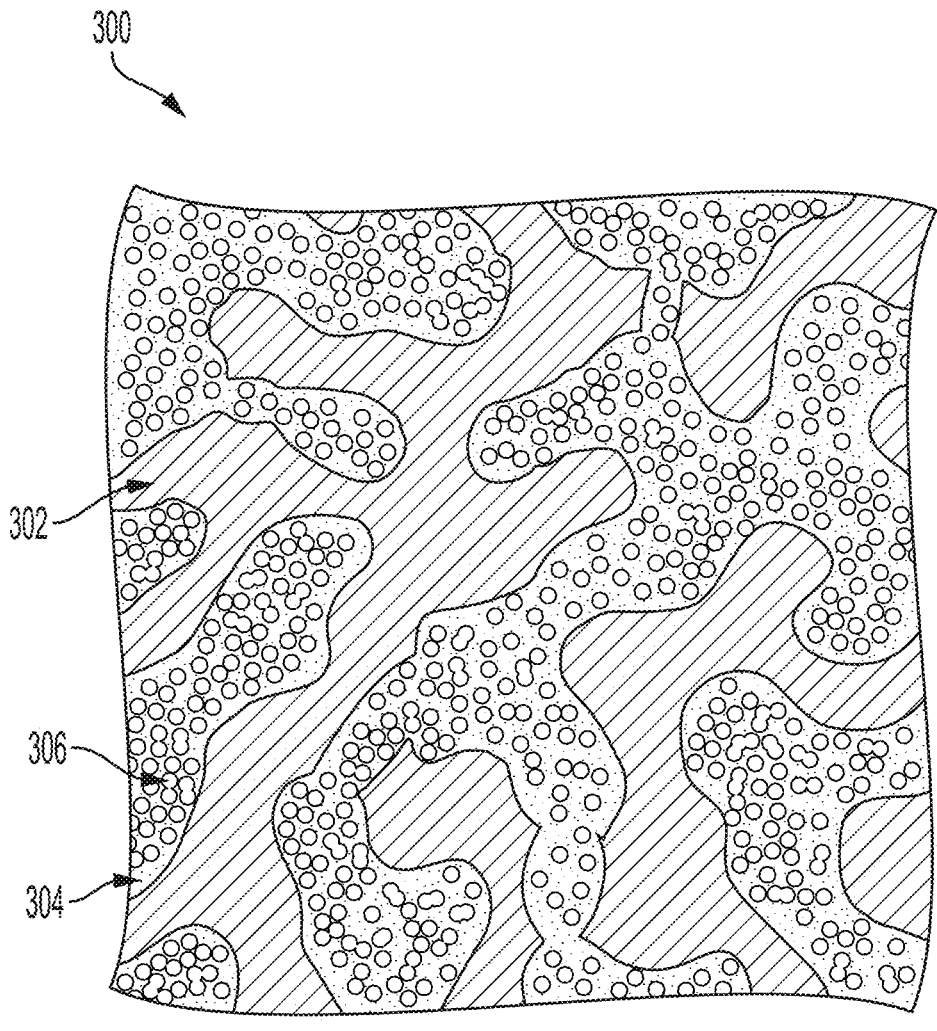
FIG. 3 is a diagram of an illustrative co-continuous polymer matrix having piezoelectric particles distributed in one of the two polymer materials.

In some examples, the first polymer material and the second polymer material may be distributed co-continuously in the polymer matrix. In a co-continuous polymer matrix, the two polymer materials intertwine in such a way that both phases remain continuous throughout the material. The morphology is analogous to that of a sponge soaked in water where both sponge and water form continuous systems. A theoretical cross section of a sample of composition 300 having a co-continuous polymer matrix is shown in FIG. 3, in which first polymer material 302 is shown intertwined with second polymer material 304. Piezoelectric particles 306 are dispersed throughout the co-continuous polymer matrix while still being substantially localized within second polymer material 304. Determining composition ranges at which dual phase co-continuity occurs can be estimated by selecting the volume ratio of the two polymer materials to approximately equal the viscosity ratio. Suitable ranges for the first and second polymer materials are further provided below.

Compositions of the present disclosure may comprise a co-continuous polymer matrix formed from a mixture of thermoplastic polymers that are immiscible with each other. The co-continuous polymer matrix may include two predominant phases, a first continuous polymer phase comprising a first polymer material and a second continuous polymer phase comprising a second polymer material. That is, the first and second continuous polymer phases may define an interpenetrating network of the polymer materials, wherein there is connectivity between at least a majority of the first continuous polymer phase and connectivity between at least a majority of the second continuous polymer phase throughout the co-continuous polymer matrix. As used herein, the terms "second continuous polymer phase," "second polymer phase," or "second polymer material" refer to the bulk phase in which the piezoelectric particles are dispersed and substantially localized therein. It is to be appreciated that the first and second thermoplastic polymers within a co-continuous polymer matrix need not necessarily contain a single polymer material of each type. For example, the first polymer phase and the second polymer phase, respectively, may include a homopolymer, copolymer, polymer blend, and/or a curable polymer material that are miscible and forms a homogenous phase and that is immiscible with the other polymer phase. In some embodiments, suitable thermoplastic polymers may include those commonly employed in additive manufacturing methods, such as fused filament fabrication.

In some examples, a co-continuous polymer matrix may be formed from an immiscible blend of thermoplastic polymers. While not limited to any particular theory, it is believed that hydrophobic/hydrophilic characteristics of a thermoplastic polymer may promote immiscibility between different thermoplastic polymers. Accordingly, in an embodiment, a first thermoplastic polymer may be more hydrophobic or hydrophilic than a second thermoplastic polymer and afford a co-continuous polymer matrix. For example, the first thermoplastic polymer may be hydrophobic and the second thermoplastic polymer may be hydrophilic, or vice versa.

Illustrative examples of suitable thermoplastic polymers may include, for instance, polyamides, polyesters (e.g., polyethylene terephthalate (PET), polyethylene terephthalate glycol (PETG), polyethylene naphthalate (PEN), and the like), polyvinyl alcohol, polyethylene glycol (PEG), polycaprolactone, polylactic acid (PLA), polylactate, polyglycolic acid, cellulose esters, poly(styrene-isoprene-styrene) (SIS), poly(styrene-ethylene-butylene-styrene) (SEBS), poly(styrene-butylene-styrene) (SBS), Poly(styrene-isoprene-styrene), acrylonitrile butadiene styrene (ABS), high-impact polystyrene (HIPS), thermoplastic urethane (TPU), ethylene propylene rubber (EPR), ethylene propylene diene rubber (EPDM), polymethylmethacrylate, polyvinylpyrrolidone, polyoxazoline (e.g., poly(2-ethyl oxazoline)), polyvinylpyrrolidone-co-polyvinyl acetate (PVP-co-PVA), polycarbonate, polyethersulfone, polyoxymethylene, polyether ether ketone, polyether aryl ketone, polyetherimide, polyethylenes including high density polyethylene (HDPE), metallocene catalyzed linear low density polyethylene (mLLDPE), and the like, polyethylene oxide (PEO), polyphenylene sulfide, polypropylene (PP), polystyrene, polyvinyl chloride, polyphenylene ethers (PPE), poly(tetrafluoroethylene), poly(vinylidene fluoride), poly(vinylidene fluoride-hexafluoropropylene), any copolymer thereof, and any combination thereof. Exemplary immiscible thermoplastic polymer combinations (e.g., first thermoplastic polymer/second thermoplastic polymer combinations) may include, for example, EPR/HDPE, EPDM/HDPE, mLLDPE/HDPE, PEO/HDPE, EPDM/PP, EPR/PP, mLLDPE/PP, EPR/mLLDPE, PS/PLA, SEBS/PLA, SEBS/PCL, and the like.

Thermoplastic polymers used in the compositions and processes disclosed herein may exhibit a melting point or softening temperature compatible with extrusion. In non-limiting examples, suitable thermoplastic polymers may exhibit a softening temperature or melting point sufficient to facilitate deposition at a temperature ranging from about 50° C. to about 400° C., or about 70° C. to about 275° C., or from about 100° C. to about 200° C., or from about 175° C. to about 250° C. Melting points may be determined using ASTM E794-06 (2018) with a 10° C. ramping and cooling rate, and softening temperatures may be determined using ASTM D6090-17.

Polymer materials suitable for use herein may include those capable of forming covalent bonds between constituent polymer chains, such as curable resins (e.g., photocurable resins and thermally curable resins that produce covalently crosslinked polymers upon curing) or polymerizable monomers, either of which may be present in combination with at least one thermoplastic polymer. Curable resins may include those that undergo self-crosslinking, or crosslinking may be mediated by the addition of one or more initiators (e.g., an initiator activated by thermal conditions (thermal initiator) or electromagnetic radiation exposure, such as UV or visible light (photoinitiator)). Covalently crosslinkable oligomers or monomers may also be present. In some embodiments, compositions described herein may include at least one curable resin that may be converted to a covalently crosslinked polymer after or during the course of forming a printed part with the compositions. Suitable resins may include photocurable resins, thermally curable resins, or any combination thereof, numerous examples of which will be familiar to one having ordinary skill in the art. The combination of at least one thermoplastic polymer and at least one curable resin may provide an easily extrudable form factor that may stiffened through covalent crosslinking after forming a printed part therefrom. Optionally, the piezoelectric particles may become covalently crosslinked to at least a portion of the polymer material and/or to each other during crosslinking as well. Metal-ligand coordinate covalent bonding also falls within the scope of covalent bonding in the disclosure herein (e.g., between a ligand upon the polymer material and a metal center upon the piezoelectric particles).

The amounts of the first and second polymer materials may be selected to maintain the two polymer materials in a substantially immiscible state, such as in a co-continuous polymer matrix. In various embodiments, the first and second polymer materials may each comprise about 10% to about 90% by weight of the composition. In some or other examples, the compositions may comprise first and second thermoplastic polymers that each may range from 1 wt. % to about 70 wt. % based on the total mass of the composition.

The ratio of the first polymer material to the second polymer material may vary over a wide range. In non-limiting examples, a ratio of the first polymer material to the second polymer material may range from about 1:99 to about 99:1 by volume. In more specific examples, the ratio of the first polymer material to the second polymer material may range from about 10:90 to about 90:10, or about 20:80 to about 80:20, or about 25:75 to about 75:25 by weight, or about 30:70 to about 70:30, or about 40:60 to about 60:40, or about 10:90 to about 20:80, or about 20:80 to about 30:70, or about 30:70 to about 40:60, or about 40:60 to about 50:50, or about 50:50 to about 60:40, or about 40:60 to about 60:40; or about 60:40 to about 70:30, or about 70:30 to about 80:20, or about 80:20 to about 90:10, each on a volume basis. In non-limiting examples, the ratio of the first polymer material to the second polymer material may be selected such that a desired extent of flexibility is realized once a printed part is formed, to facilitate extrusion, and/or to tailor the distribution of piezoelectric particles in a printed part.

Suitable piezoelectric particles for use in the present disclosure are not believed to be particularly limited, provided that the piezoelectric particles may be adequately blended within the polymer matrix, preferably remaining as individuals once blending with the polymer material has taken place. Illustrative examples of piezoelectric materials that may be present in piezoelectric particles suitable for use herein include, but are not limited to, crystalline and non-crystalline ceramics, and naturally occurring piezoelectric materials. Suitable crystalline ceramics exhibiting piezoelectric properties may include, but are not limited to, lead zirconate titanate (PZT), potassium niobate, sodium tungstate, $Ba_2NaNNb_5O_5$, and $Pb_2KNb_5O_{15}$. Suitable non-crystalline ceramics exhibiting piezoelectric properties may include, but are not limited to, sodium potassium niobate, bismuth ferrite, sodium niobate, barium titanate, bismuth titanate, and sodium bismuth titanate. Particularly suitable examples of piezoelectric particles for use in the disclosure herein may include those containing, for instance, lead zirconate titanate, doped lead zirconate titanate, barium titanate, strontium titanate, barium strontium titanate, lead titanate, lead magnesium niobate, lead magnesium niobate-lead titanate, sodium potassium niobate, calcium copper titanate, bismuth sodium titanate, gallium phosphate, quartz, tourmaline and any combination thereof. Suitable dopants for lead zirconate titanate may include, but are not limited to Ni, Bi, La, and Nd.

Other suitable piezoelectric particles may include naturally occurring piezoelectric materials such as, for example, cane sugar, Rochelle salt, topaz, bone, or any combination thereof. Still other examples of piezoelectric materials that may be used include, for example, ZnO, $BiFO_3$, and $Bi_4Ti_3O_{12}$.

The piezoelectric particles employed in the disclosure herein may have an average particle size in a micrometer or nanometer size range. In more particular examples, suitable piezoelectric particles may have a diameter of about 25 microns or less, or about 10 microns or less, such as about 1 micron to about 10 microns, or about 2 microns to about 8 microns. Smaller piezoelectric particles, such as those having an average particle size under 100 nm or an average particle size of about 100 nm to about 500 nm or about 500 nm to about 1 micron may also be utilized in the disclosure herein. Average particle sizes in the disclosure herein represent $D_{50}$ values, which refers to a diameter at which 50% of the sample (on a volume basis unless otherwise specified) is comprised of particles having a diameter less than said diameter. $D_{50}$ may also be referred to as the "average particle size." Such average particle size measurements may be made by analysis of optical images, including via SEM analysis, or using onboard software of a Malvern Mastersizer 3000 Aero S instrument, which uses light scattering techniques for particle size measurement.

Agglomeration refers to an assembly comprising a plurality of particulates that are loosely held together through physical bonding forces. Agglomerates may be broken apart through input of energy, such as through applying ultrasonic energy, to break the physical bonds. Individual piezoelectric particles that have been produced through de-agglomeration may remain de-agglomerated once blending with a polymer material has taken place. That is, defined agglomerates are not believed to re-form during the blending processes with a polymer material as disclosed herein. It is to be appreciated that two or more piezoelectric particles may be in contact with one another in a melt-blended piezoelectric composite, but the extent of interaction is less than that occurring in an agglomerate of piezoelectric particles. In non-limiting examples, agglomerates of piezoelectric particles may have a size ranging from about 100 microns to about 200 microns, and individual piezoelectric particles obtained after de-agglomeration may be in a size range disclosed above, such as a size range of about 1 micron to about 5 microns or about 1 micron to about 10 microns, or any other size range disclosed above. Particles under 1 micron in size (nanoparticles) may also be obtained in some instances. The de-agglomerated piezoelectric particle sizes may be maintained following formation of a composite having a form factor specified in the present disclosure.

Concentration of the piezoelectric particles in a designated polymer phase may result through processing conditions (kinetic) or from molecular interactions (thermodynamic). Kinetic methods may involve modifying process conditions such that the piezoelectric particles are localized within particular polymer materials. Kinetic methods may include dispersing the piezoelectric particle in one polymer material by melt blending prior to combining the resulting melt blend with the other polymer material. Other techniques for controlling particle dispersion may include mixing the piezoelectric particles with a polymer material at an elevated melt temperature, while subsequent melt blending with the other polymer material is performed at a lower melt temperature sufficient to enable mixing, but that reduces migration of the piezoelectric particles between polymer materials.

Alternately, or in addition to kinetic methods, thermodynamic methods may be utilized to tailor the distribution of piezoelectric particles throughout the polymer matrix, such as by introducing covalent bonding and/or non-covalent interactions between the piezoelectric particles and one or more of the polymer materials in the polymer matrix. In some cases, thermodynamic methods may include a combination of strategies of utilizing covalent bonding and non-covalent interactions to control the distribution of piezoelectric particles in a composition of the present disclosure. For example, non-covalent interactions may be used to aid in setting the piezoelectric particle distribution, while covalent bonding may be introduced (e.g., through curing) to modify piezoelectric properties during or after printing.

Introducing covalent bonds into a composition of the present disclosure may include covalently crosslinking constituent polymer chains of the polymer matrix, curing of resin, monomer, or oligomer components, covalently crosslinking the piezoelectric particles and at least a portion of the polymer matrix, and/or forming covalent bonds to a thermoplastic polymer without covalent crosslinking otherwise taking place. Within the polymer matrix, covalent bond formation may include covalently crosslinking polymer chains through the incorporation of reactive co-monomers, free-radical crosslinking, and/or heat-induced or photo-induced covalent crosslinking. Various additional strategies for promoting covalent bond formation may be contemplated by persons having ordinary skill in the art. For example, there may be covalent bonds between the piezoelectric particles and at least a portion of the polymer matrix before printing of the compositions takes place, provided that the covalent bonding does not involve covalent crosslinking or the amount of crosslinking is not too extensive to disrupt extrudability. When present, covalent bonding between the piezoelectric particles and a given polymer material may also promote dispersion of the piezoelectric particles and enhancement of the piezoelectric properties.

Covalent bonding between one or more of the polymer materials of the polymer matrix with the piezoelectric particles may involve functionalizing (generating or applying reactive groups to) the surface of the piezoelectric particles and/or on the constituent polymer chains with one or more reactive groups capable of forming carbon-carbon or carbon-heteroatom bonds. Reactive groups upon the piezoelectric particles may include reactive species complementary to or otherwise reactive with the polymer chains (or pendant groups therefrom) within the polymer matrix, which may include alkenyl groups, halogens, hydroxy groups, carboxyl groups, amines, imines, azides, isocyanates, sulfhydyls, and the like.

Functionalization of piezoelectric particles to promote covalent bonding and/or non-covalent interactions therewith may include chemically preparing the surface (e.g., oxidation, reduction, acid treatment) to expose reactive groups, and/or the use of linkers or other surface modification chemistry. Native functional groups upon the surface may be utilized as well. Linker moieties to a surface may include mono-, bi-, or poly-functional linkers that introduce functional groups for subsequent covalent bonding, non-covalent interactions, grafting, or polymerization. Linker moieties suitable for attaching to piezoelectric particles having hydroxyl groups upon a surface thereof may include, for example, silane-terminated or thiol-terminated linker moieties. Illustrative silane functionalities that can form a covalent bond with surface hydroxyl groups of piezoelectric particles may include, for example, alkoxysilanes, dialkoxysilanes, trialkoxysilanes, alkyldialkoxysilanes, dialkylalkoxysilanes, aryloxysilanes, diaryloxysilanes, triaryloxysilanes, silanols, disilanols, trisilanols, and any combination thereof. Specific linkers may include 3-(trimethoxysilyl) propyl methacrylate (TMSPM), aminopropyltriethoxysilane; aminopropyltrimethoxysilane; diethylaminomethyltriethoxysilane; bis(triethoxysilylpropyl)disulfide; mercaptopropyltrimethoxysilane; 3-thiocyantopropyltriethoxysilane; glycidoxypropyltrimethoxysilane; methacryloxypropyltriethoxysilane; and the like. Other types of groups that may bond covalently to the surface of piezoelectric particles for introducing various functionalities thereon include, for example, phosphines, phosphine oxides, phosphonic acids, phosphonyl esters, carboxylic acids, alcohols, and amines.

Similarly, if not already present in a given type of polymer material, a co-monomer containing a complementary functional group for forming a covalent bond and/or a non-covalent interaction may be copolymerized with one or more additional monomers to produce a polymer material suitable for use in the disclosure herein. Grafting of a complementary functional group onto the backbone of a polymer material may also be conducted in some instances.

Functionalization of the thermoplastic polymers within the polymer matrix may include the use of reactive polymers or monomers having reactive groups, or polymers that form a reactive species upon exposure to a suitable stimulus such as thermal conditions or electromagnetic radiation of a suitable wavelength. Reactive polymers and monomers suitable for forming covalent crosslinks in this manner may contain multiple alkenyl groups such as ethylene glycol diacrylate, isoprene, and polymers thereof. Reactive polymers may also include polymers that form radicals capable of forming covalent crosslinks within the polymer matrix or to piezoelectric particles when exposed to UV, such as poly(styrene-butadiene-styrene) (SBS).

Compositions of the present disclosure may comprise a plurality of piezoelectric particles non-covalently interacting with a polymer material by one or more non-covalent interactions. More specifically, compositions of the present disclosure may include a plurality of piezoelectric particles non-covalently interacting with a polymer material by $\pi$-$\pi$ bonding, hydrogen bonding, electrostatic interactions stronger than van der Waals interactions, or any combination thereof. In various embodiments, the piezoelectric particles and the polymer material may interact by at least $\pi$-$\pi$ bonding.

Control of non-covalent interactions may include modifying the first polymer material, the second polymer material, and/or the surface of the piezoelectric particles to include complementary functionalities capable of undergoing $\pi$-$\pi$ bonding, hydrogen bonding, and/or electrostatic interactions stronger than van der Waals interactions. Advantageously, a range of polymer materials having functionality capable of interacting with piezoelectric particles through $\pi$-$\pi$ bonding, hydrogen bonding, and/or electrostatic interactions are commercially available or may be readily accessed by incorporation of a co-monomer capable of promoting such non-covalent interactions. Grafting of a functionality capable of undergoing a non-covalent interaction onto a polymer backbone may also take place. Similarly, piezoelectric particles may contain surface functional groups, such as surface hydroxyl groups, that may be functionalized with a moiety capable of promoting a non-covalent interaction as specified herein.

In the case of $\pi$-$\pi$ bonding, for example, the piezoelectric particles and the polymer material may each contain at least one aryl group, such that the aryl groups in both locations interact with one another by $\pi$-$\pi$ stacking interactions. In the case of hydrogen bonding, one of the piezoelectric particles and the polymer material may contain a hydrogen bond donor and the other of the piezoelectric particles and the polymer material may contain a hydrogen bond acceptor. For example, one of the piezoelectric particles and the polymer material may contain hydroxyl or amine groups that may function as hydrogen bond donors, and the other of the piezoelectric particles and the polymer material may contain an oxygen, nitrogen or fluorine atom that accepts a hydrogen bond from the hydrogen bond donor. In the case of electrostatic interactions, the piezoelectric particles and the polymer material may contain oppositely charged functional groups, such that electrostatic charge pairing (ionic bonding) occurs between the two, including induced charge interactions in a dipole. For example, one of the piezoelectric particles and the polymer material may contain a protonated amine or quaternary ammonium group, and the other of the piezoelectric particles and the polymer material may contain a deprotonated carboxylic acid or sulfonic acid. Other types of suitable electrostatic interactions may include, for example, charge-dipole, dipole-dipole, induced dipole-dipole, charge-induced dipole, and the like.

When needed for promoting a given non-covalent interaction and not already present in a specified polymer material, a co-monomer may be introduced that contains a functional group capable of facilitating at least one non-covalent interaction according to the disclosure herein, such as a co-monomer containing at least one aryl group, a hydrogen bond donor, a hydrogen bond acceptor, or a charged group. It should be appreciated that some of the polymers and co-polymers listed herein may already contain a functional group capable of promoting at least one non-covalent interaction. Thus, depending on the type of polymer and the type of non-covalent interaction desired, and an additional co-monomer or similar modification of the polymer material may or may not need to be included.

The piezoelectric particles may interact non-covalently in at least one manner with at least one of the first and second polymer materials, preferably the polymer material in which the piezoelectric particles are localized, including one or more of $\pi$-$\pi$ bonding, hydrogen bonding, electrostatic interactions stronger than van der Waals interactions, or any combination thereof. The polymer material and/or the piezoelectric particles may be selected to promote one or more of these non-covalent interactions, or the piezoelectric particles may be further functionalized to promote a desired non-covalent interaction with a specified polymer material. For example, surface hydroxyl groups upon piezoelectric particles may be functionalized with a silane moiety having at least one aryl group appended thereto, which may form a $\pi$-$\pi$ bond with a polymer material also bearing at least one aryl group. Other types of functionalization strategies for introducing an aryl group upon piezoelectric particles may be envisioned by one having ordinary skill in the art.

Non-covalent interactions resulting from $\pi$-$\pi$ bonding may arise when two aromatic groups interact with each other. That is, to produce a π-π noncovalent interaction between the piezoelectric particles and the polymer material, both the piezoelectric particles and the polymer material contain an aromatic group. Non-covalent interactions by π-π bonding can occur when the delocalized π-electron clouds of aromatic ring systems interact interfacially with one another, preferably extended aromatic ring systems containing two or more fused aromatic rings. The aromatic group upon the piezoelectric particles may be directly attached to the surface of the particle or be appended by a linker moiety covalently attached to the surface of the particle. Linker moieties suitable for attaching an aromatic group to piezoelectric particles may include, for example, silane-terminated or thiol-terminated linker moieties. Illustrative silane functionalities that can form a covalent bond with surface hydroxyl groups of piezoelectric particles may include, for example, alkoxysilanes, dialkoxysilanes, trialkoxysilanes, alkyldialkoxysilanes, dialkylalkoxysilanes, aryloxysilanes, diaryloxysilanes, triaryloxysilanes, silanols, disilanols, trisilanols, aryloxysilanes, diaryloxysilanes, and any combination thereof. Similarly, if not already present in a given type of polymer material, a co-monomer containing an aromatic group may be copolymerized with one or more non-aromatic monomers to produce a polymer suitable for use in the disclosure herein. Grafting of an aromatic group onto the backbone of a polymer material may also be conducted in some instances. Aromatic groups suitable for promoting non-covalent interactions between piezoelectric particles and a polymer material may include, for example, phenyl, naphthalenyl, anthracenyl, phenanthrenyl, pyrenyl, benz(a) anthracenyl, tetracenyl, benzo[a]pyrenyl, benzo[e]pyrenyl, benzo(g,h,i)perylenyl, chrysenyl, and dibenz(a,h)anthracenyl.

Non-covalent interactions resulting from hydrogen bonding may arise when a hydrogen bond donor and a hydrogen bond acceptor interact with each other. The hydrogen bond donor is located upon one of the piezoelectric particles and the polymer material and the hydrogen bond acceptor is located upon the other of the piezoelectric particles and the polymer material. Hydrogen bond donors may include, for example, hydroxyl groups, amine groups, carboxylic acid groups, and the like. Hydrogen bond acceptors may include any oxygen atom or oxygen-containing functional group, any nitrogen atom or nitrogen-containing functional group, or a fluorine atom. If not already present upon the piezoelectric particles or the polymer material, such hydrogen bond donors or hydrogen bond acceptors may be introduced by one having ordinary skill in the art. Optionally, hydrogen bond donors or hydrogen bond acceptors may be introduced onto piezoelectric particles through a linker moiety using similar attachment chemistries to those discussed above.

Non-covalent interactions resulting from electrostatic interactions may arise when a piezoelectric particle and a polymer material having opposite charges interact with each other (charge pairing or charge-charge interactions), including induced charge interactions in a dipole. Positively charged groups that may be present within either the piezoelectric particles or the polymer material may include, for example, protonated amines and quaternary ammonium groups. Negatively charged groups that may be present within either the piezoelectric particles or the polymer material may include, for example, carboxylates, sulfates, sulfonates, and the like. Like other types of non-covalent interactions, suitable groups capable of charge pairing may be introduced upon piezoelectric particles or a polymer material by one having ordinary skill in the art, including through attachment of a linker moiety to the piezoelectric particles. Other types of suitable electrostatic interactions may include, for example, charge-dipole, dipole-dipole, induced dipole-dipole, charge-induced dipole, and the like.

The polymer material or the piezoelectric particles may constitute a majority component of the composites disclosed herein. In non-limiting examples, piezoelectric particles are present in a percent by volume of the composite (vol. %) in amount ranging from at least about 10 vol. %, or at least about 20 vol. %, or at least about 30 vol. %, or at least about 40 vol. %, or at least about 50 vol. %, or at least about 60 vol. %, or at least about 70 vol. %, or at least about 80 vol. %, or at least about 85 vol. %, or at least about 90 vol. %, or at least about 95 vol. % of the composites based on total volume. In more particular examples, the piezoelectric particles may comprise about 10 vol. % to about 85 vol. %, or about 25 vol. % to about 75 vol. %, or about 40 vol. % to about 60 vol. %, or about 50 vol. % to about 70 vol. % of the composite. A minimum volume percentage may be selected such that satisfactory piezoelectric properties are realized. A maximum volume percentage of the piezoelectric particles may be chosen such that the composite maintains structural integrity and extrudability. For example, in the case of composite filaments, the amount of piezoelectric particles may be chosen to maintain structural integrity as a continuous filament and that also remains printable by fused filament fabrication. Preferably, the piezoelectric particles may be distributed within a polymer matrix under conditions at which the piezoelectric particles remain substantially dispersed as individuals without becoming significantly agglomerated with each other.

Piezoelectric composites may include one or more fillers that modify the mechanical and/or piezoelectric properties. Fillers compatible with the compositions disclosed herein may include carbon nanomaterials (e.g., carbon nanotubes, carbon nanofibers, graphene, fullerenes, diamond-like carbon, and carbon black), nanocrystalline cellulose, cellulose nanofibrils, silica, silica-alumina, alumina such as (pseudo) boehmite, gibbsite, titania, zirconia, cationic clays or anionic clays such as saponite, bentonite, kaoline, sepiolite, hydrotalcite, and the like. Fillers may also include metal oxides such as alumina trihydrate (ATH), alumina monohydrate, magnesium hydroxide, magnesium silicate, talc, silicas such as fumed silica and precipitated silica, and calcium carbonate, calcium metasilicate, Wollastonite, Dolomite, Perlite, hollow glass spheres, kaolin, and the like. UV stabilizers such as titanium oxide, zinc oxide, benzophenones, benzotriazoles, aryl esters, sterically hindered amines, the like, and any combination thereof may also be present. The fillers may be present in the same location as the piezoelectric particles and/or distributed in a different polymer phase than the piezoelectric particles.

Composite filaments of the present disclosure may be suitable for use in fused filament fabrication and comprise at least one thermoplastic polymer and a plurality of piezoelectric particles dispersed in the at least one thermoplastic polymer. Optionally, at least one polymer precursor may be combined with the at least one thermoplastic polymer in the polymer material. The at least one polymer precursor may comprise a portion of the first or second polymer material. Alternately or additionally, suitable composite filaments may comprise at least one curable precursor that may be converted into a thermoplastic polymer or a covalently crosslinked polymer when printing the composite filaments, optionally in further combination with at least one thermoplastic polymer. In non-limiting examples, the composite filaments may be formed by melt blending, preferably such that the piezoelectric particles remain in a substantially non-agglomerated form following formation of the composite filaments. In various embodiments, the piezoelectric particles may be no more agglomerated than an extent of particle agglomeration prior to melt blending.

Composite pellets having distributed piezoelectric particles may similarly be obtained by melt blending, in non-limiting examples. Instead of being produced in an elongate form similar to composite filaments, composite pellets may be characterized by an aspect ratio of about 5 or less and particle sizes having dimensions ranging from about 100 microns to about 5 cm. Composite pellets may feature a loading of piezoelectric particles in the polymer material similar to that of composite filaments, and once printed and poled, they may provide a similar range of $d_{33}$ values. Similarly, the piezoelectric particles may remain in a substantially non-agglomerated form in the composite pellets produced according to the disclosure herein.

Composite powders may be obtained by grinding, milling, pulverizing, or similar processes to produce non-elongate particulates having an irregular shape and a particle size of about 10 microns to about 1 mm, or about 10 microns to about 500 microns, or about 10 microns to about 100 microns. The particle size distribution may be relatively wide when composite powders are produced by grinding, but the particle size distribution may be narrowed by sieving or a similar size sorting technique, if desired.

Figure 4:
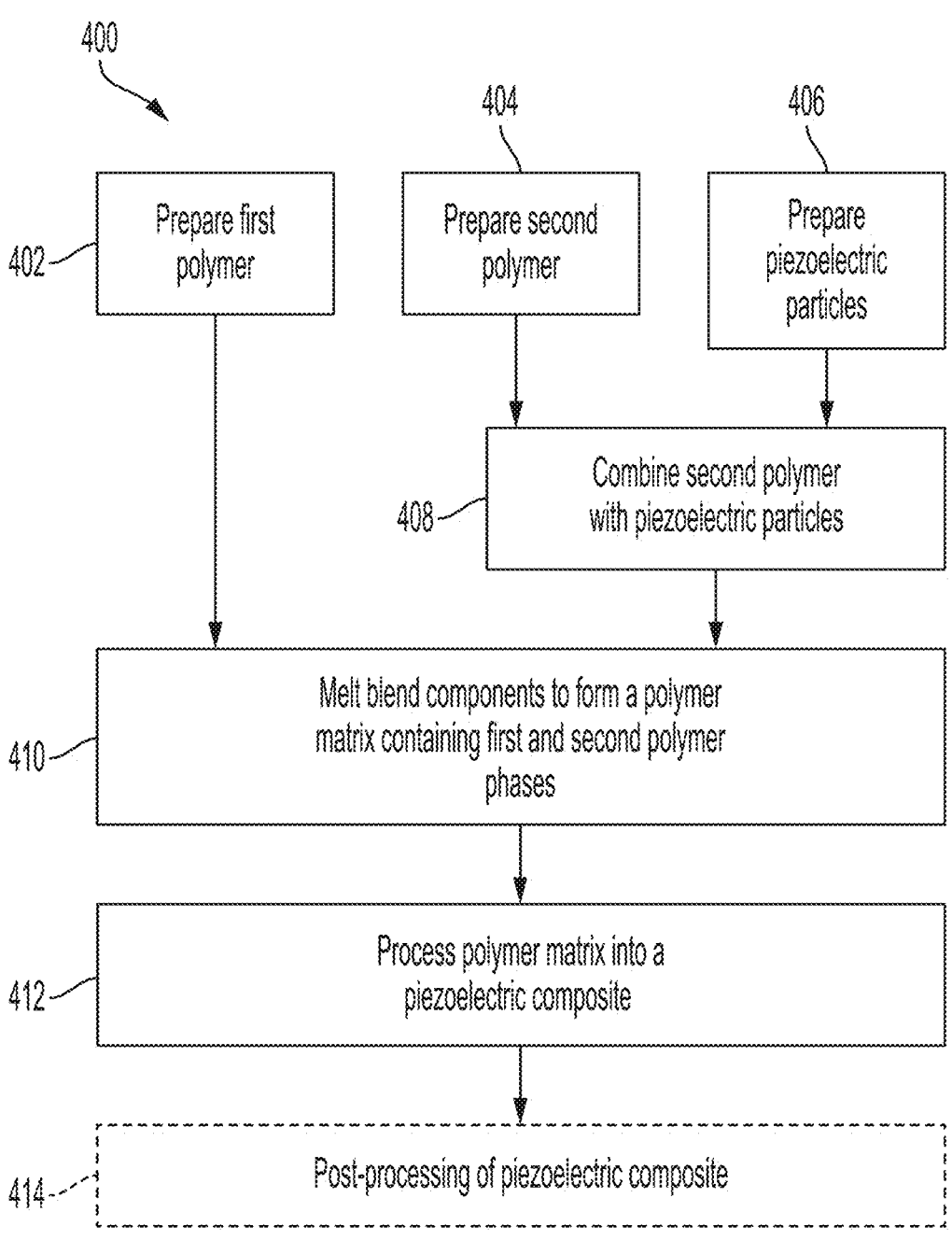
FIG. 4 is a flow chart depicting an illustrative method of forming a composition of the present disclosure.

During manufacturing of compositions of the present disclosure, the polymer materials may be melted and combined to form a co-continuous polymer matrix having a first polymer material and a second polymer material that are immiscible. The order in which the components are combined is not considered limited. A schematic of one possible manufacturing process 400 for producing a composition is shown in FIG. 4. To form the co-continuous polymer matrix, a first polymer material is prepared at 402, and a second polymer material is prepared at 404. Preparation at 402 and 404 may include selecting the polymer materials on the basis of immiscibility, determining the ratio of the first and second polymers to form a co-continuous polymer matrix, dispensing the polymers, milling or grinding the polymers to a size suitable for melt blending or combinations thereof.

Before combination with the first and second polymer materials, piezoelectric particles are prepared at 406, which may include sizing and homogenization by de-agglomeration, sieving, milling, and the like. In a particular method, piezoelectric particles may be de-agglomerated by probe sonication, specifically probe sonication of larger piezoelectric particles or agglomerates thereof, wherein the input of sonic energy promotes de-agglomeration and formation of a reduced particle size. Homogenization may similarly promote de-agglomeration. Sized and homogenized piezoelectric particles may have an average particle size of about 10 microns or less, such as a particle size ranging from about 1 micron to about 5 microns, or about 1 micron to about 2 microns, or other size ranges disclosed above. These piezoelectric particle sizes may be maintained in the composites disclosed herein, with the piezoelectric particles remaining in a substantially non-agglomerated form once blended with a polymer material to define a composite.

In some embodiments, preparation of the piezoelectric particles at 406 may include preparing the particle surfaces to increase compatibility with the polymer matrix, which may include surface cleaning, modification, functionalization, and/or combination with one or more additives such as flow improvers, compatibilizers, surfactants, and the like.

Prepared piezoelectric particles from 406 are then combined with the second polymer material at 408, which may include physical agitation, such as by a blender, Haake compounder, or other suitable method. Piezoelectric particles may be added at any step during the process. In one example, piezoelectric particles are combined with and distributed in the second polymer material during a separate melt blending step, followed by combination of the mixture with the first polymer material from 402 for a second melt blending step to create the composition.

The first polymer material from 402 and the second polymer material and piezoelectric particle mixture from 408 are combined in a melt blending process at 410. Suitable melt blending processes may include melt mixing with stirring, followed by extrusion of the resulting melt blend, or direct blending via extrusion with a single-, twin-, or multi-screw extruder. Surprisingly, such melt blending processes followed by further extrusion may afford a good distribution of the piezoelectric particles within the second polymer phase of the resulting composite and printed parts obtained therefrom. Cryo-milling, grinding or shredding before further extrusion of the composite may further facilitate the extrusion process and promote distribution of the piezoelectric particles within at least a portion of the polymer material.

Melt blending processes disclosed herein may be conducted with or without the addition of solvent. The addition of solvent may lead to trace solvents being incorporated into downstream composites and printed parts in some cases. Melt blending processes described herein may result in little to no void formation in the composites even in the absence of surfactants and other surface compatibilizers, which otherwise may be detrimental to include in a printed part. Further surprisingly and advantageously, little or no agglomeration of the piezoelectric particles within the polymer material may occur following melt blending, which may desirably improve the piezoelectric properties obtained after poling. A uniform distribution of individual piezoelectric particles in the polymer material or a portion thereof may be realized in some instances, wherein the piezoelectric particles remain above a percolation threshold concentration within the polymer material. The piezoelectric particles may be considered above a percolation threshold concentration if the piezoelectric particles communicate with one another to generate a voltage when a mechanical load is being applied to the composites.

Melt mixtures obtained from 410 may be processed into a piezoelectric composite at 412 and obtained in the form of solids, which may be further formulated into an extrudable paste composition, if desired. Prepared piezoelectric composites obtained at 412 may be processed by any suitable method for its intended end use, including formed into an article, filament, pellets, and the like.

Processing may include shredding the resulting composite from the melt blend at 410 to a coarse powder for use in downstream applications, such as extrusion, molding, or the generation of filaments or other stocks for additive manufacture. Preparation of filaments and other composites may be by extrusion of the composition, including the use of a single-screw extruder, multi-screw extruder, and the like. Filaments manufactured from compositions disclosed herein may have an outside diameter appropriate for a selected fabrication method. For example, piezoelectric composite filaments suitable for fused filament fabrication may have diameters that are appropriate for the drive unit for a particular printing system (for example, common filament diameters include 1.75 mm and 2.85 mm). Other properties that may determine if a composite filament is suitable for fused filament fabrication include the temperature required to extrude the filament, which should not be undesirably high. A suitable composite filament for fused filament fabrication may further minimize printing issues, such as oozing from the print nozzle or clogging of the print nozzle, which may be impacted by the overall viscosity of the composite at the printing temperature. In addition, composite filaments suitable for fused filament fabrication may afford form parts that easily separate from a print bed, have sufficient mechanical strength once printed, and exhibit good interlayer adhesion. Additional characteristics of suitable composite filaments and other form factors are specified below.

Composite filaments compatible with fused filament fabrication may be formed in the disclosure herein. Although composite filaments may be an advantageous and particularly versatile form factor, it is to be realized that composite pellets may also be produced through melt blending processes and used in similar additive manufacturing processes. Namely, a thermoplastic polymer and piezoelectric particles may be combined with one another under melt blending conditions, and instead of extruding to form composite filaments, larger extrudates may be produced, which may then be cut, shredded, pulverized, or the like to afford composite pellets of a specified size and geometry or composite powders having even smaller dimensions and a wide distribution of particle sizes. Other than having a different shape, the microscopic morphology of the composite pellets and composite powders may be similar to that of composite filaments. Like composite filaments, composite pellets may be subsequently processed into printed parts having piezoelectric properties under suitable additive manufacturing conditions.

In fused filament fabrication processes utilizing composite filaments disclosed herein, the print head may contain one or more extruders, such that a first polymer filament containing a build material is deposited from a first extruder. The build material may comprise a composite filament in accordance with the disclosure above. Optionally, a second polymer filament containing a removable support material may be deposited from a second extruder to form a removable support for defining one or more overhangs in a printed part formed from the build material. Filaments (composite filaments or non-composite filaments) suitable for use in the foregoing manner may range from about 0.5 mm to about 10 mm in diameter, or about 1 mm to about 5 mm in diameter, particularly about 1.5 mm to about 3.5 mm in diameter. Standard filament diameters for many three-dimensional printers employing fused filament fabrication technology are 1.75 mm or 2.85 mm (about 3.0 mm). It is to be recognized that any suitable filament diameter may be used in accordance with the disclosure herein, provided that the filament is compatible with a user's particular printing system. Similarly, the length and/or color of the composite filaments is/are not believed to be particularly limited in the printing processes disclosed herein. Preferably, the composite filaments disclosed herein and utilized in processes for forming a printed part are continuous and of spoolable length, such as at least about 1 foot, or at least about 5 feet, or at least about 10 feet, or at least about 25 feet, or at least about 50 feet, or at least about 100 feet, or at least about 250 feet, or at least about 500 feet, or at least about 1000 feet. The term "spoolable length" means sufficiently long to be wound on a spool or reel. It is to be appreciated that a composite filament of "spoolable length" need not necessarily be spooled, such as when the composite filament is too rigid to be wound onto a spool.

Accordingly, composite filaments produced according to the disclosure herein may have a diameter and length compatible for use in fused filament fabrication additive manufacturing processes. Particularly suitable examples may include composite filament diameters ranging from about 1 mm to about 10 mm. Various filament processing conditions may be utilized to adjust the filament diameter, as explained hereinafter.

Extrudable composite pastes may comprise a plurality of piezoelectric particles, a polymer material, and a sufficient amount of at least one solvent to promote extrusion at a temperature of interest. The solvent may be optional in some instances, particularly if at least one polymer precursor is present in combination with the piezoelectric particles. That is, the at least one polymer precursor may take the place of a solvent or replace a portion of a solvent when forming an extrudable composite paste according to the disclosure herein. The extrudable composite pastes may be monophasic, biphasic, or triphasic. When biphasic or higher, the piezoelectric particles and the polymer material may be present in one or both of the at least two immiscible phases. The polymer material and the piezoelectric particles may be processed into a composite, such as through melt blending and decreasing particle size as discussed above, wherein particles of the pre-made composite are present in at least one phase of the extrudable composite paste. Alternately, a polymer material may be at least partially dissolved in at least one phase of an extrudable composite paste, and dispersion of the piezoelectric particles within at least a portion of the polymer material may take place as the extrudable composite paste is extruded into a desired shape when forming a printed part. For example, the piezoelectric particles may become dispersed in the polymer material as the at least one solvent evaporates during printing of the extrudable composite pastes.

Optionally, the extrudable composite pastes may comprise a sol-gel material. When present, the sol-gel material may be included in an amount ranging from about 10 vol. % to about 20 vol. %, based on a combined mass of the extrudable composite paste. Inclusion of a sol-gel may result in a stiff matrix following curing, which may enhance the piezoelectric response obtained from the piezoelectric particles.

Suitable solvents that may be present in the extrudable composite pastes may include high-boiling solvents such as, but are not limited to, 1-butanol, 2-methyl-2-propanol, 1-pentanol, 3-methyl-1-butanol, 2,2-dimethyl-1-propanol, cyclopentanol, 1-hexanol, cyclohexanol, 1-heptanol, 1-octanol, propylene carbonate, tetraglyme, glycerol, 2-(2-methoxyethoxy)acetic acid or any combination thereof. Other high-boiling solvents having a boiling point in the range of about 100° C. to about 300° C. may be used as well. Suitable amounts of the at least one solvent may range from about 3 vol. % to about 35 vol. %, based on total mass of the extrudable composite paste.

In some embodiments, the extrudable composite pastes may be biphasic, in which case the at least one solvent may comprise water and a water-immiscible solvent. In non-limiting examples, an aqueous phase may comprise the water, a water-soluble polymer, and the piezoelectric particles, and an immiscible organic phase may comprise a non-water soluble polymer material and an optional organic solvent. When present, a sol-gel material may be present in the aqueous phase. The water-soluble polymer and the non-water soluble polymer material may be distributed co-continuously with one another, as described in more detail below.

The extrudable composite pastes may exhibit shear-thinning behavior, such that they may be readily extruded but quickly assume a fixed shape having a yield stress of about 100 Pa or greater upon being printed. In non-limiting examples, the extrudable composite pastes may have a viscosity of about 15,000 cP to about 200,000 cP when being sheared at rate of about 5-10 $s^{-1}$.

Suitable methods for forming composite filaments compatible with fused filament fabrication or other various form factors for composites may take place through melt blending of a first thermoplastic polymer, a second thermoplastic polymer, and a plurality of piezoelectric particles, which may include melt mixing with stirring, followed by extrusion, or direct extrusion with a twin-screw extruder. More specific methods may comprise providing a first thermoplastic polymer; providing a second thermoplastic polymer, wherein the first thermoplastic polymer and the second thermoplastic polymer are immiscible with each other; forming a first mixture by combining the second thermoplastic polymer with a plurality of piezoelectric particles; forming a second mixture by combining the first thermoplastic polymer with the first mixture; melt blending the second mixture to form a polymer matrix, such as a co-continuous polymer matrix, in which the first thermoplastic polymer forms a first polymer phase and the second thermoplastic polymer forms a second polymer phase, and wherein the plurality of piezoelectric particles are concentrated in one of the polymer phases; and forming a composition having a desired form factor.

The compositions may be converted to various usable forms by extruding the melt blend to form a composite filament containing the piezoelectric particles mixed in a substantially non-agglomerated form with the at least one thermoplastic polymer. Composite pellets of the present disclosure may be formed in a similar manner, but without extruding directly into a filament form. Instead, the composite may be extruded into a larger diameter fiber that may be cut, shredded, pulverized, ground, or the like to afford composite pellets having a similar morphology to the composite filaments.

In further embodiments, the melt blend may be additionally processed before extrusion takes place (e.g., in instances where melt blending takes place prior to extrusion). In particular, the melt blend may be cooled and solidified (e.g., below the melting point or softening temperature of a thermoplastic polymer), and cryogenically milling the melt blend after solidifying and prior to extruding the melt blend. Cryogenic milling will be familiar to one having ordinary skill in the art and may be conducted to reduce the particle size of the melt blend with lower risk of localized heating of the thermoplastic polymer and/or the piezoelectric particles taking place and promoting degradation thereof. Although cryogenic milling may be advantageous, it is to be appreciated that non-cryogenic milling may also be conducted, or the melt blend may be extruded directly without being cooled and solidified first in alternative process variations. Shredding or grinding of the melt blend may also be conducted prior to extrusion as an alternative process variation. In some instances, composite pellets may likewise be obtained without proceeding through a secondary extrusion process.

Additive manufacturing processes described herein may include providing a composition of the present disclosure, specifically a composite filament, a composite pellet, a composite powder, or a composite paste, and forming a printed part by depositing the composition layer-by-layer. Suitable layer-by-layer deposition techniques will be familiar to one having ordinary skill in the art and may be selected based upon the chosen form factor of the composite. In non-limiting examples, suitable layer-by-layer deposition techniques may include fused filament fabrication, direct writing, or any combination thereof.

When the polymer material comprises at least one thermoplastic polymer, the composition may be heated at or above a melting point or softening temperature of the at least one thermoplastic polymer when forming the printed part. Thus, once the at least one thermoplastic polymer cools, a printed part having a specified shape may be realized. Composite pastes need not necessarily be heated above the melting point or softening temperature to facilitate extrusion. When the polymer material further comprises at least one polymer precursor, such as a curable resin or other covalently crosslinkable moiety, forming the printed part may further comprise curing the at least one polymer or other moiety precursor. Curing may take place by, for example, thermal curing or photocuring, following formation of a printed part.

In order to optimize or initiate piezoelectric properties, a printed part may be poled. Poling involves subjecting a material to a very high electric field so that dipoles of a piezoelectric material orient themselves to align in the direction of the applied field. Suitable poling conditions will be familiar to one having ordinary skill in the art. In non-limiting examples, poling may be conducted by corona poling, electrode poling or any combination thereof. In corona poling, a piezoelectric material is subjected to a corona discharge in which charged ions are generated and collect on a surface. An electric field is generated between the charged ions on the surface of a material and a grounded plane on the other side of the material. The grounded plane may be directly adhered to the material or present as a grounded plate. In the electrode poling (contact poling), two electrodes are placed on either side of a piezoelectric material, and the material is subjected to a high electric field generated between the two electrodes.

Piezoelectric composites of the present disclosure may be capable of being printed as a single-layer thin film having a $d_{33}$ value, after poling, of about 1 pC/N or more at a film thickness of about 200 microns, as measured using an APC International Wide-Range $d_{33}$ meter. Thin film thicknesses are measured using standard techniques separately from the $d_{33}$ measurements. In more particular examples, the composites may be capable of forming single-layer thin films having a $d_{33}$ value, after poling, of about 1 pC/N to about 400 pC/N, or about 2 pC/N to about 200 pC/N, or about 3 pC/N to about 100 pC/N, or about 1 pC/N to about 75 pC/N, or about 5 pC/N to about 50 pC/N, or about 1 pC/N to about 10 pC/N, or about 2 pC/N to about 8 pC/N, or about 3 pC/N to about 10 pC/N, or about 1 pC/N to about 5 pC/N, or about 4 pC/N to about 7 pC/N under these conditions. The loading of piezoelectric particles and suitable blending conditions to maintain the piezoelectric particles as individuals once distributed within the polymer material may be selected to afford a desired extent of piezoelectricity. Single-layer film thicknesses that may be printable with the composites may range from about 10 μm to about 500 μm in thickness or about 25 μm to about 400 μm in thickness.

Although poling may be conducted as a separate step, as described above, poling may also be conducted in concert with an additive manufacturing process. In non-limiting examples, a high voltage may be applied between an extrusion nozzle supplying molten composite (formed from the composite filaments or composite pellets disclosed herein) and a grounded plane onto which the molten composite is being deposited to form a printed part.

Referring again to FIG. 4, methods of producing piezoelectric composites may include an optional post-processing step at 414 to modify various properties. For example, when the polymer material contains a polymer precursor or an activatable crosslinking chemistry, a post-processing step at 414 may include curing a piezoelectric composite by thermal curing or photocuring. Post-processing may involve forming covalent bonds between polymer chains of the polymer matrix and/or to surface groups on the piezoelectric particles. Curing may take place by, for example, thermal curing or photocuring, following formation of a printed part.

The placement of the post-processing step in FIG. 4 is not considered particularly limited. In some cases, post-processing methods (e.g., crosslinking and/or curing) may occur prior to or forming a part by additive manufacturing. Similarly, poling at least a portion of a printed part may also take place before and/or after post-processing at 414 to induce a piezoelectric response therein.

Embodiments disclosed herein include:

A. Compositions comprising piezoelectric particles. The compositions comprise: a plurality of piezoelectric particles dispersed in at least a portion of a continuous polymer matrix comprising a first polymer material and a second polymer material that are immiscible with each other; wherein the piezoelectric particles are substantially localized in one of the first polymer material or the second polymer material.

A1. Compositions comprising piezoelectric particles. The compositions comprise: a plurality of piezoelectric particles located in at least a portion of a polymer matrix comprising a first polymer material and a second polymer material that are immiscible with each other; wherein the piezoelectric particles are substantially localized in one of the first polymer material or the second polymer material.

A2. Printed parts comprising the composition of A or A1.

B. Additive manufacturing processes. The processes comprise: providing the composition of A or A1, and forming a printed part by depositing the composition layer-by-layer.

Each of embodiments A, A1, A2, and B may have one or more of the following additional elements in any combination:

Element 1: wherein the first and second polymer materials and the piezoelectric particles collectively define an extrudable material that is a composite having a form factor selected from the group consisting of a composite filament, a composite pellet, a composite powder, and a composite paste.

Element 2: wherein the piezoelectric particles comprise about 10 vol. % to about 85 vol. % of the composite.

Element 3: wherein the first and second polymer materials and the piezoelectric particles collectively define an extrudable material that is a composite filament.

Element 4: wherein the first and second polymer materials comprise first and second thermoplastic polymers, respectively.

Element 5: wherein the first and second polymer materials are distributed co-continuously in the polymer matrix.

Element 6: wherein the piezoelectric particles are covalently bonded to at least a portion of the polymer matrix, are covalently crosslinkable with at least a portion of the polymer matrix, and/or interact non-covalently with at least a portion of the polymer matrix by π-π bonding, hydrogen bonding, electrostatic interactions stronger than van der Waals interactions, or any combination thereof.

Element 7: wherein a volume ratio of the first polymer material to the second polymer material is about 25:75 to about 75:25.

Element 8: wherein the piezoelectric particles are substantially non-agglomerated when combined with the polymer matrix.

Element 9: wherein the piezoelectric particles have an average particle size of about 10 microns or less.

Element 10: wherein the piezoelectric particles comprise a piezoelectric material selected from the group consisting of lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline, and any combination thereof.

Element 11: wherein the composition further comprises a carbon nanomaterial dispersed in at least one of the first polymer material or the second polymer material.

Element 12: wherein the first and second polymer materials and the piezoelectric particles collectively define an extrudable material that is a composite filament, and forming the printed part comprises a fused filament fabrication process.

Element 13: wherein the process further comprises poling at least a portion of the printed part.

By way of non-limiting example, exemplary combinations applicable to A, A1, A2, and B include, but are not limited to: 1 or 3, and 2; 1 or 3, and 4; 1 or 3, 4 and 5; 1 or 3, and 6; 1 or 3, and 7; 1 or 3, and 8; 1 or 3, and 9; 1 or 3, and 10; 1 or 3, and 11; 2 and 4; 2, 4 and 5; 2 and 6; 2 and 7; 2 and 8; 2 and 9; 2 and 10; 2 and 11; 4 and 5; 4 and 6; 4 and 7; 4 and 8; 4 and 9; 4 and 10; 4 and 11; 4-6; 4, 5 and 7; 4, 5 and 8; 4, 5 and 9; 4, 5 and 10; 4, 5 and 11; 6 and 7; 6 and 8; 6 and 9; 6 and 10; 6 and 11; 7 and 8; 7 and 9; 7 and 10; 7 and 11; 8 and 9; 8 and 10; 8 and 11; 9 and 10; 9 and 11; and 10 and 11. With respect to B, any of the foregoing may be in further combination with one or more of 12 or 13.

Clauses of the Disclosure

The present disclosure is further directed to the following non-limiting embodiments:

Clause 1. A composition comprising:
    a plurality of piezoelectric particles dispersed in at least a portion of a continuous polymer matrix comprising a first polymer material and a second polymer material that are immiscible with each other;
        wherein the piezoelectric particles are substantially localized in one of the first polymer material or the second polymer material.

Clause 1A. A composition comprising:
    a plurality of piezoelectric particles located in at least a portion of a polymer matrix comprising a first polymer material and a second polymer material that are immiscible with each other;
        wherein the piezoelectric particles are substantially localized in one of the first polymer material or the second polymer material.

Clause 2. The composition of clause 1/1A, wherein the first and second polymer materials and the piezoelectric particles collectively define an extrudable material that is a composite having a form factor selected from the group consisting of a composite filament, a composite pellet, a composite powder, and a composite paste.

Clause 3. The composition of clause 2, wherein the piezoelectric particles comprise about 10 vol. % to about 85 vol. % of the composite.

Clause 4. The composition of any one of clauses 1/1A-3, or the composition of clause 1/1A, wherein the first and second polymer materials and the piezoelectric particles collectively define an extrudable material that is a composite filament.

Clause 5. The composition of any one of clauses 1/1A-4, or the composition of clause 1/1A, wherein the first and second polymer materials comprise first and second thermoplastic polymers, respectively.

Clause 6. The composition of any one of clauses 1/1A-5, or the composition of clause 1/1A, wherein the first and second polymer materials are distributed co-continuously in the polymer matrix.

Clause 7. The composition of any one of clauses 1/1A-6, or the composition of clause 1/1A, wherein the piezoelectric particles are covalently bonded to at least a portion of the polymer matrix, are covalently cross-linkable with at least a portion of the polymer matrix, and/or interact non-covalently with at least a portion of the polymer matrix by $\pi$-$\pi$ bonding, hydrogen bonding, electrostatic interactions stronger than van der Waals interactions, or any combination thereof.

Clause 8. The composition of any one of clauses 1/1A-7, or the composition of clause 1/1A, wherein a volume ratio of the first polymer material to the second polymer material is about 25:75 to about 75:25.

Clause 9. The composition of any one of clauses 1/1A-8, or the composition of clause 1/1A, wherein the piezoelectric particles are substantially non-agglomerated when combined with the polymer matrix.

Clause 10. The composition of any one of clauses 1/1A-9, or the composition of clause 1/1A, wherein the piezoelectric particles have an average particle size of about 10 microns or less.

Clause 11. The composition of any one of clauses 1/1A-10, or the composition of clause 1/1A, wherein the piezoelectric particles comprise a piezoelectric material selected from the group consisting of lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline, and any combination thereof.

Clause 12. The composition of any one of clauses 1/1A-11, or the composition of clause 1/1A, further comprising:
a carbon nanomaterial dispersed in at least one of the first polymer material or the second polymer material.

Clause 13. An additive manufacturing process comprising:
providing the composition of any one of clauses 1/1A-12, or the composition of clause 1/1A; and
forming a printed part by depositing the composition layer-by-layer.

Clause 14. The additive manufacturing process of clause 13, wherein the first and second polymer materials and the piezoelectric particles collectively define an extrudable material that is a composite filament, and forming the printed part comprises a fused filament fabrication process.

Clause 15. The additive manufacturing process of clause 13 or clause 14, or the composition of clause 13, wherein the first and second polymer materials comprise first and second thermoplastic polymers, respectively.

Clause 16. The additive manufacturing process of clause 15, wherein the first and second polymer materials are distributed co-continuously in the polymer matrix.

Clause 17. The additive manufacturing process of clause 13 or clause 14, or the additive manufacturing process of clause 13, wherein the first and second polymer materials are distributed co-continuously in the polymer matrix.

Clause 18. The additive manufacturing process of any one of clauses 13-17, or the additive manufacturing process of clause 13, wherein the piezoelectric particles are substantially non-agglomerated when combined with the polymer matrix.

Clause 19. The additive manufacturing process of any one of clauses 13-18, or the additive manufacturing process of clause 13, wherein the piezoelectric particles have an average particle size of about 10 microns or less.

Clause 20. The additive manufacturing process of any one of clauses 13-19, or the additive manufacturing process of clause 13, wherein the piezoelectric particles are covalently bonded to at least a portion of the polymer matrix, are covalently crosslinkable with at least a portion of the polymer matrix, and/or interact non-covalently with at least a portion of the polymer matrix by $\pi$-$\pi$ bonding, hydrogen bonding, electrostatic interactions stronger than van der Waals interactions, or any combination thereof.

Clause 21. The additive manufacturing process of any one of clauses 13-20, or the additive manufacturing process of clause 13, wherein the composition further comprises a carbon nanomaterial dispersed in at least one of the first polymer material or the second polymer material.

Clause 22. The additive manufacturing process of any one of clauses 13-21, or the additive manufacturing process of clause 13, further comprising:
poling at least a portion of the printed part.

Clause 23. A printed part comprising the composition of any one of clauses 1/1A-12, or the composition of clause 1/1A.

Clause 24. The printed part of clause 23, wherein the first polymer material and the second polymer material are distributed co-continuously in the polymer matrix.

To facilitate a better understanding of the present disclosure, the following examples of preferred or representative embodiments are given. In no way should the following examples be read to limit, or to define, the scope of the disclosure.

EXAMPLES

Lead zirconate titanate (PZT, APC International, Ltd.) was sonicated using a Branson digital probe sonicator for 30 minutes in water at 25% amplitude to break up particle agglomerates. The original PZT agglomerate size of approximately 100 microns afforded PZT particles in a 1-5 micron size range following sonication, with a majority of the PZT particles being in a 1-2 micron size range. The PZT particles were dried at 80° C. overnight in a vacuum oven.

Alternately, a suspension of PZT particles in water (250 g PZT particles in 250 g water) was homogenized under high-shear conditions for 30 minutes using an IKA ULTRA- TURRAX T25 homogenizer. The PZT particles were isolated by centrifugation, washed with isopropanol, and dried at 80° C. in a vacuum oven overnight.

High density polyethylene (HDPE) with a MFI of 12 g/10 min (190° C./2.16 kg) and poly(ethylene oxide) (PEO) with a number average molecular weight of 35,000 g/mol were both obtained from Sigma-Aldrich. Poly-ε-caprolactone (PCL) with a number average molecular weight of 80,000 g/mol was obtained from Sigma-Aldrich. Poly(lactic acid) (PLA) was obtained from NatureWorks (Ingeo Biopolymer 3D850) and had a MFR of 7-9 g/10 min. (210° C./2.16 kg). Polystyrene (PS) with a weight average molecular weight of 192,000 g/mol and an MFI of 6-9 g/10 min. (200° C./5 kg) was obtained from Sigma-Aldrich. Linear triblock styrene/ethylene/butylene copolymer (SEBS having an MFI of 22 g/10 min (230° C./10 min.) was obtained from Kraton Polymers (KRATON G1657 M).

Example 1: PEO:HDPE (1:1)/30 vol. % PZT Composite. High density polyethylene/poly(ethylene oxide) (1:1 by volume) was blended in a Haake compounder at 150° C. Blending was conducted by adding HDPE pellets (16.63 g) to the mixing chamber and melting. The de-agglomerated PZT particles (115.02 g) were then added, and the materials were mixed for 5 minutes. The PEO (19.60 g) was then added to the mixture, and mixing was continued for an additional 5 minutes. The mixture was discharged onto an aluminum pan and cooled to ambient temperature. The resulting composite was then shredded into granulate form (SHR3D IT, 3devo).

Example 2: PS:PLA (1:1)/40 vol. % PZT Composite. This composite was prepared as described in Example 1, except the de-agglomerated PZT (153.4 g) was melt mixed with PLA (18.6 g) at 190° C. prior to adding polystyrene (15.75 g). The PLA was dried at 80° C. for 4 hours prior to use.

Example 3: SEBS:PLA (2:3)/30 vol. % PZT Composite. This composite was prepared as described in Example 1, except the de-agglomerated PZT (115.0 g) was melt mixed with PLA (26.0 g) at 190° C. and then adding SEBS (12.6 g).

Example 4: SEBS:PCL (2:3)/30 vol. % PZT Composite. This composite was prepared as described in Example 1, except the de-agglomerated PZT (115.0 g) was melt mixed with PCL (24.0 g) at 120° C. prior to increasing the temperature to 190° C. and adding SEBS (12.6 g).

Comparative Example 1: HDPE/40 vol. % PZT Composite. This composite was prepared as described in Example 1, except the de-agglomerated PZT (153.4 g) was melt mixed with HDPE (28.5 g) at 190° C. without further polymer addition.

Comparative Example 2: PEO:HDPE (1:1) Blend. This blend was prepared as described in Example 1, except no de-agglomerated PZT was added, and HDPE (23.8 g) was melt mixed with PEO (28.0 g) at 150° C.

Comparative Example 3: PLA/40 vol. % PZT Composite. This composite was prepared by solution blending as an alternative to melt blending. 18.6 g of PLA pellets were dissolved in 200 mL of refluxing THF with magnetic stirring. The solution was cooled to room temperature, and 153.4 g of de-agglomerated PZT was added. The resulting mixture was stirred with an overhead stirrer for 15 minutes. The mixture was then poured onto a glass plate, and the solvent was allowed to evaporate overnight. The resulting composite film was heated in a vacuum oven at 70° C. for 6 hours to remove traces of the solvent.

Comparative Example 4: PCL/40 vol. % PZT Composite. This composite was prepared as described in Example 1, except that de-agglomerated PZT (153.4 g) was melt mixed with PCL (34.4 g) at 100° C. without further polymer addition.

SEM Image Analysis. Film samples (2 cm×2 cm) for SEM imaging were prepared for each of the composites above using a hydraulic press at 150° C.

Figure 5:
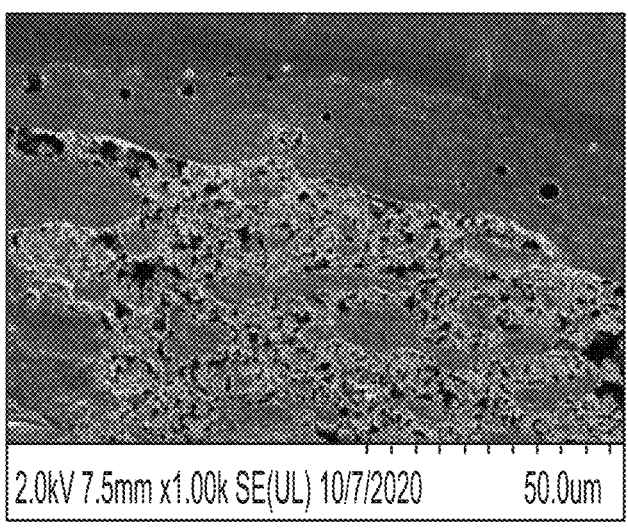
FIG. 5 is an illustrative scanning electron micrograph of an exemplary polymer formulation containing PEO:HDPE at a 1:1 volume ratio with 30 vol. % of PZT.

FIG. 5 is a cross-sectional SEM image of the composite of Example 1. As shown, a co-continuous morphology was formed, and the PZT particles were preferentially distributed in one of the continuous phases, specifically in the HDPE phase. The PZT-rich HDPE phase is distinguished in the SEM image by its whiter and coarser surface due to the concentrated PZT particles. The distribution of the PZT is believed to arise from the processing sequence and processing time selection to limit the migration of the PZT to the more polar PEO phase.

Figure 6:
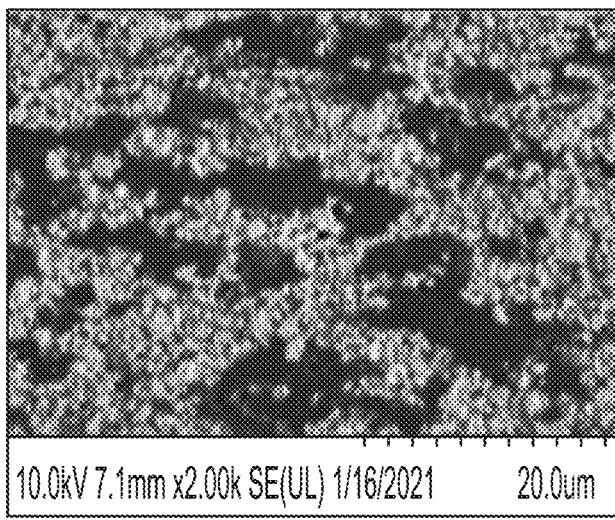
FIG. 6 is an illustrative scanning electron micrograph of an exemplary polymer formulation containing PS:PLA at a 1:1 volume ratio with 40 vol. % of PZT.

FIG. 6 is a cross-sectional SEM image of the composite of Example 2. As shown, the PZT particles are distributed throughout the continuous PLA phase but not significantly in the PS phase. In this case too, the selective distribution of the PZT particles in PLA phase results from the processing conditions and compatibility. The PZT-rich PLA phase is distinguished in the SEM images by its whiter and coarser surface due to the concentrated PZT particles. Since the PZT particles were first mixed with PLA and the PZT particles are more compatible with the polar PLA than with than with the non-polar PS, migration of the PZT to the PS was limited.

Figure 7:
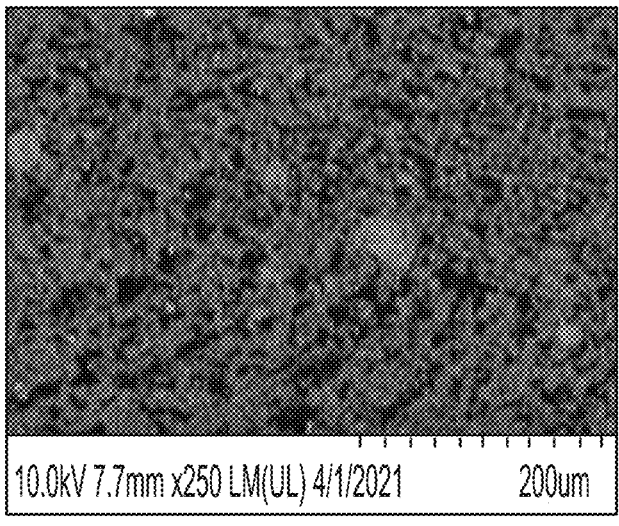
FIG. 7 is an illustrative scanning electron micrograph of an exemplary polymer formulation containing SEBS:PLA at a 2:3 volume ratio with 30 vol. % of PZT.

FIG. 7 is a cross-sectional SEM image of the composite of Example 3. As shown the PZT particles were distributed throughout the continuous PLA phase but not in the SEBS phase as a result of the processing conditions. The PZT-rich PLA phase is distinguished by its whiter and coarser surface in the SEM images due to the concentrated PZT particles.

Figure 8:
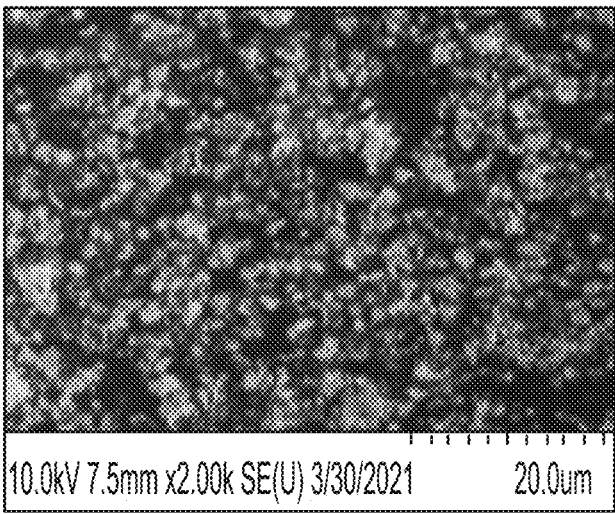
FIG. 8 is an illustrative scanning electron micrograph of an exemplary polymer formulation containing SEBS:PCL at a 2:3 volume ratio with 40 vol. % of PZT.

FIG. 8 is a cross-sectional SEM image of the composite of Example 4. As shown, the PZT particles were again distributed throughout the continuous PCL phase but not in the SEBS phase. The use of softer materials in this composite results in fuzzier borders between the PZT-rich PCL phase and the SEBS phase.

Figure 9:
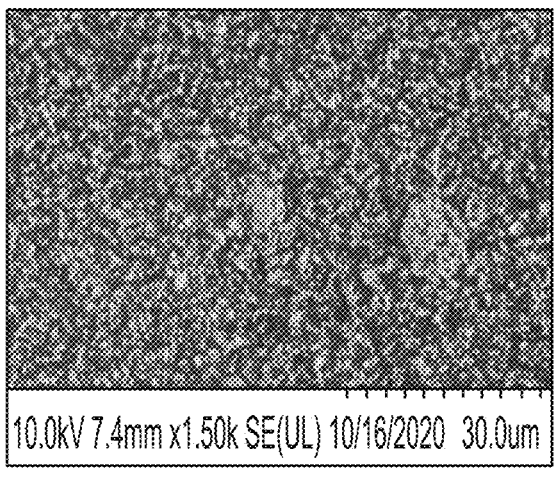
FIG. 9 is an illustrative scanning electron micrograph of a comparative polymer formulation containing HDPE with 40 vol. % of PZT.

FIG. 9 is a cross-sectional SEM image of the composite of Comparative Example 1. As shown, PZT was distributed throughout the composite.

Figure 10:
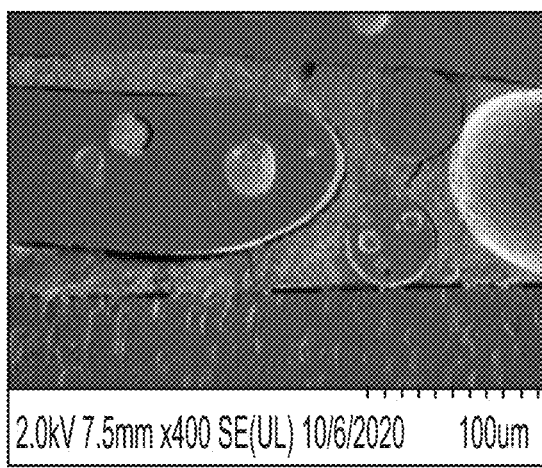
FIG. 10 is an illustrative scanning electron micrograph of a comparative polymer formulation containing PEO:HDPE at 1:1 volume ratio.

FIG. 10 is a cross-sectional SEM image of the blend of Comparative Example 2. As shown, the HDPE (darker areas) and PEO (lighter areas) are distributed in a co-continuous manner.

Figure 11:
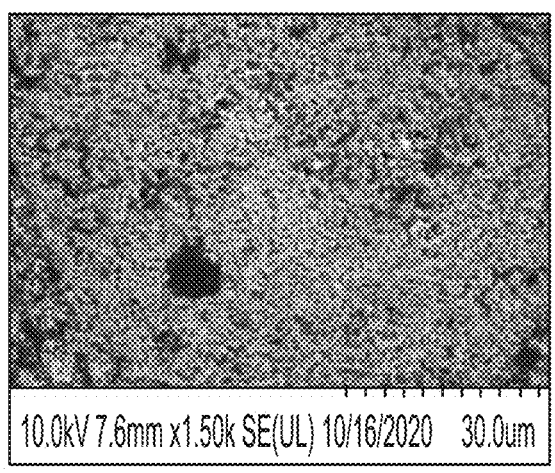
FIG. 11 is an illustrative scanning electron micrograph of a comparative polymer formulation containing PLA with 40 vol. % of PZT.

FIG. 11 is a cross-sectional SEM image of the composite of Comparative Example 3. As shown, the PZT particles were distributed throughout PLA. There were some large PZT agglomerates present, as well as some smaller areas devoid of PZT, which are believed to arise from the solution casting process.

Filament Extrusion. For filament extrusion, the samples were first shredded to afford a coarse powder, and the powder was then extruded using a single-screw Filabot FX6 extruder. The extruder was modified with a digital voltage readout to control the motor speed and extrusion rate. The Filabot EX6 filament extruder is capable of zonal temperature variation among the feed port nozzle, a back zone, a middle zone, and a front zone. The air path of the Filabot EX6 filament extruder may be further adjusted with respect to distance from the feed port nozzle or by raising the air path on a jack. The air path height was kept constant here, and 100% airflow was used during extrusion. Table 1 below summarizes the extrusion conditions and filament properties used when preparing composite filaments from the selected samples from above. Measurement of the filament diameter was conducted using an inline thickness gauge.

TABLE 1

| Formulation | Comp. Ex. 1 | Ex. 1 | Ex. 2 | Ex. 3 | Ex. 4 |
|---|---|---|---|---|---|
| | HDPE/ 40 vol. % PZT | PEO:HDPE (1:1)/30 vol. % PZT | PS:PLA (1:1)/40 vol. % PZT | SEBS:PLA (2:3)/30 vol. % PZT | SEBS:PCL (2:3)/30 vol. % PZT |
| Feed Temp (° C.) | 60 | 40 | 60 | 40 | 30 |
| Back Temp (° C.) | 190 | 200 | 230 | 190 | 160 |
| Middle Temp (° C.) | 190 | 200 | 230 | 210 | 190 |
| Front Temp (° C.) | 170 | 200 | 230 | 210 | 190 |
| Voltage (V) | 6.8 | 30 | 200 | 200 | 210.0 |
| Nozzle Size (mm) | 2.0 | 3.0 | 2.0 | 1.75 | 1.75 |
| Airflow | 100% | 100% | 100% | 100% | 100% |
| Winding Speed (rpm) | 0.9 rpm | N/A | N/A | N/A | N/A |

Each of the composites of Examples 1-4 were extrudable into robust filaments, but only certain members of the comparative samples could be extruded into a filament form. For example, the composite of Comparative Example 3 was too brittle to form a stable filament. In contrast, the composite of Example 3 was readily extrudable into a filament in spite of its slightly higher effective concentration of PZT in PLA (42 vol. % vs. 40 vol. %). The filaments obtained from the composites of Examples 1-4, each containing a co-continuous polymer matrix, also tended to produce a better quality filament in comparison to those obtained from the comparative samples lacking a co-continuous polymer matrix.

Printing. The filaments were printed using a Hyrel Hydra 16A 3D printer. Single and multiple layer structures were printed as 2 cm×2 cm squares for evaluation of piezoelectric properties of the composites. Each printed layer was ~200 μm thick.

Piezoelectric Properties. Piezoelectric properties of the composite films or thermopressed samples were evaluated by measuring the piezoelectric charge constant ($d_{33}$ value) using an APC International Wide-Range $d_{33}$ meter or a Piezotest PM300 Piezometer. The $d_{33}$ meter is capable of measuring $d_{33}$ values between 1-2000 pC/N at an operating frequency of 110 Hz and an amplitude of 0.25 N. Thermopressed samples were prepared as 20 mm squares of varying thicknesses using a Carver hydraulic press with the samples heated above their melting point or glass transition temperature in a mold. The sample thicknesses varied between 100-1000 μm. Further description of the samples and their piezoelectric properties is provided in Table 2 below.

Prior to making the $d_{33}$ measurements, all samples were poled by a corona poling method in which the sample was exposed to a corona discharge for times ranging from 2 to 60 minutes, but more typically 30 minutes. In the corona poling method, the sample was first coated with a thin layer of sputtered metal (Au, Pt, or Al) on one side of the sample, which was then exposed to a wire-generated corona (6-8 kV) located at a distance of about 1 mm from the sample. Since a surface area of approximately 300 μm² is exposed to the corona at a given time, the sample was moved to pole the complete surface through exposure to the corona. The poling process was not optimized. Contact poling in a high dielectric medium may be used as an alternative poling procedure.

TABLE 2

| Entry | Composite | Formulation | Thickness (μm) | $d_{33}$ Thermopressed (pC/N) | $d_{33}$ Printed (pC/N) |
|---|---|---|---|---|---|
| 1 | Comp. Ex. 1 | HDPE/ 40 vol. % PZT | 100 300 500 | 1.8 ± 0.6 — 0.2 ± 0.2 | — 2.4 1.2 |
| 2 | Ex. 1 | PEO:HDPE (1:1)/30 vol. % PZT | 400 | 6.0 ± 2.0 | — |
| 3 | Ex. 2 | PS:PLA (1:1)/40 vol. % PZT | 400 | 7.4 ± 1.7 | — |
| 4 | Comp. Ex. 3 | PLA/40 vol. % PZT | 400 | 2.2 ± 1.5 | — |
| 5 | Ex. 3 | SEBS:PLA (2:3)/30 vol. % PZT | 400 | 7.0 ± 0.0 | — |
| 6 | Comp. Ex. 4 | PCL/40 vol. % PZT | 150 | — | 10.7 |
| 7 | Ex. 4 | SEBS:PCL (2:3)/30 vol. % PZT | 150 300 500 1000 | — — — — | 13.0 11.0 10.0 8.0 |

The $d_{33}$ value for the composite of Example 1 (Entry 2) was higher than that of the composite of Comparative Example 1 (Entry 1), even though the comparative example contained a higher loading of PZT particles. The high $d_{33}$ value is believed to result from the higher effective PZT concentration in the co-continuous polymer matrix of the composite of Example 1. A similar effect was seen for the composites of Example 2 (Entry 4) and Example 3 (Entry 5) in comparison to the composite of Comparative Example 3 (Entry 3), where localization of the PZT particles enhanced the $d_{33}$ values. Since the PZT particles are distributed in only one of the polymer phases in the composite of Example 2, their effective concentration is double that of the composite of Comparative Example 3, even though the concentrations appear to be otherwise equal. In the composite of Example 3, the effective PZT loading is ~42 vol. % as a result of localization of PZT particles in one of the polymer phases.

In the composite of Example 4 (Entry 7), the $d_{33}$ value was again higher than in the composite of Comparative Example 4 (Entry 6) in spite of a lower PZT loading being present. As further shown, the $d_{33}$ values tended to decrease with increasing sample thickness, likely due to decreased poling efficiency.

All documents described herein are incorporated by reference herein for purposes of all jurisdictions where such practice is allowed, including any priority documents and/or testing procedures to the extent they are not inconsistent with this text. As is apparent from the foregoing general description and the specific embodiments, while forms of the disclosure have been illustrated and described, various modifications can be made without departing from the spirit and scope of the disclosure. Accordingly, it is not intended that the disclosure be limited thereby. For example, the compositions described herein may be free of any component, or composition not expressly recited or disclosed herein. Any method may lack any step not recited or disclosed herein. Likewise, the term "comprising" is considered synonymous with the term "including." Whenever a method, composition, element or group of elements is preceded with the transitional phrase "comprising," it is understood that we also contemplate the same composition or group of elements with transitional phrases "consisting essentially of," "consisting of," "selected from the group consisting of," or "is" preceding the recitation of the composition, element, or elements and vice versa.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present disclosure. At the very least, and not as an attempt to limit the application of the doctrine of equivalents to the scope of the claim, each numerical parameter should at least be construed in light of the number of reported significant digits and by applying ordinary rounding techniques.

Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

One or more illustrative embodiments are presented herein. Not all features of a physical implementation are described or shown in this application for the sake of clarity. It is understood that in the development of a physical embodiment of the present disclosure, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for one of ordinary skill in the art and having benefit of this disclosure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to one having ordinary skill in the art and having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein.

What is claimed is the following:

1. A composition comprising:
   a plurality of piezoelectric particles in at least a portion of a polymer matrix comprising a first polymer material and a second polymer material that are immiscible with each other;
   wherein the piezoelectric particles are localized in one of the first polymer material or the second polymer material; and
   wherein the first polymer material and the second polymer material are distributed co-continuously in the polymer matrix.

2. The composition of claim 1, wherein the first and second polymer materials and the piezoelectric particles collectively define an extrudable material that is a composite having a form factor selected from the group consisting of a composite filament, a composite pellet, a composite powder, and a composite paste.

3. The composition of claim 1, wherein the first and second polymer materials and the piezoelectric particles collectively define an extrudable material that is a composite filament.

4. The composition of claim 1, wherein the first and second polymer materials comprise first and second thermoplastic polymers, respectively.

5. The composition of claim 1, wherein the piezoelectric particles are covalently bonded to at least a portion of the polymer matrix, are covalently crosslinkable with at least a portion of the polymer matrix, and/or interact non-covalently with at least a portion of the polymer matrix by $\pi$-$\pi$ bonding, hydrogen bonding, electrostatic interactions stronger than van der Waals interactions, or any combination thereof.

6. The composition of claim 1, wherein a volume ratio of the first polymer material to the second polymer material is about 25:75 to about 75:25.

7. The composition of claim 1, wherein the piezoelectric particles are non-agglomerated when combined with the polymer matrix.

8. The composition of claim 1, wherein the piezoelectric particles have an average particle size of about 10 microns or less.

9. The composition of claim 1, further comprising:
   a carbon nanomaterial dispersed in at least one of the first polymer material or the second polymer material.

10. An additive manufacturing process comprising:
    providing the composition of claim 1; and
    forming a printed part by depositing the composition layer-by-layer.

11. The additive manufacturing process of claim 10, wherein the first and second polymer materials and the piezoelectric particles collectively define an extrudable material that is a composite filament, and forming the printed part comprises a fused filament fabrication process.

12. The additive manufacturing process of claim 10, wherein the first and second polymer materials comprise first and second thermoplastic polymers, respectively.

13. The additive manufacturing process of claim 10, wherein the piezoelectric particles are non-agglomerated when combined with the polymer matrix.

14. The additive manufacturing process of claim 10, wherein the piezoelectric particles are covalently bonded to at least a portion of the polymer matrix, are covalently crosslinkable with at least a portion of the polymer matrix, and/or interact non-covalently with at least a portion of the polymer matrix by $\pi$-$\pi$ bonding, hydrogen bonding, electrostatic interactions stronger than van der Waals interactions, or any combination thereof.

15. The additive manufacturing process of claim 10, wherein the composition further comprises a carbon nano-material dispersed in at least one of the first polymer material or the second polymer material.

16. A printed part comprising the composition of claim 1.

* * * * *